US012560728B2

(12) United States Patent
Iniewski et al.

(10) Patent No.: US 12,560,728 B2
(45) Date of Patent: Feb. 24, 2026

(54) RADIATION DETECTOR HAVING IMPROVED EQUALIZATION OF PIXEL RESPONSE

(71) Applicant: REDLEN TECHNOLOGIES, INC., Saanichton (CA)

(72) Inventors: Krzysztof Iniewski, Port Moody (CA); Olivier Tousignant, Brentwood Bay (CA); Michael Ayukawa, Victoria (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 231 days.

(21) Appl. No.: 18/470,937

(22) Filed: Sep. 20, 2023

(65) Prior Publication Data

US 2024/0159924 A1 May 16, 2024

Related U.S. Application Data

(60) Provisional application No. 63/383,157, filed on Nov. 10, 2022.

(51) Int. Cl.
*G01T 1/24* (2006.01)
*G01T 1/20* (2006.01)
(Continued)

(52) U.S. Cl.
CPC .......... *G01T 1/241* (2013.01); *G01T 1/20184* (2020.05); *G01T 1/243* (2013.01); *G01T 1/244* (2013.01); *G01T 1/247* (2013.01); *G01T 1/2985* (2013.01); *H10F 39/1895* (2025.01); *H10F 39/811* (2025.01)

(58) Field of Classification Search
CPC ..... G01T 1/241; G01T 1/20184; G01T 1/243; G01T 1/244; G01T 1/247; G01T 1/2985; H10F 39/1895; H10F 39/811; H10F 39/809
See application file for complete search history.

(56) References Cited

U.S. PATENT DOCUMENTS 6,025,647 A * 2/2000 Shenoy ............. H01L 23/49838
257/E21.511
8,866,098 B2 * 10/2014 Hayatsu ................ H10F 39/804
250/370.11

(Continued)

FOREIGN PATENT DOCUMENTS

WO WO-2004038810 A2 * 5/2004 ........... H10F 39/809

OTHER PUBLICATIONS

Ayukawa, M. et al., "Radiation Detector Module With Local Processing Unit," U.S. Appl. No. 18/462,859, filed Sep. 7, 2023.
(Continued)

*Primary Examiner* — Casey Bryant
(74) *Attorney, Agent, or Firm* — THE MARBURY LAW GROUP PLLC

(57) ABSTRACT
A radiation detector unit including an interposer configured to electrically connect a pixelated radiation sensor positioned on a front side of the interposer to an application-specific integrated circuit (ASIC) positioned on a back side of the interposer, where the interposer has at least one feature which equalizes the energy resolution (ER) response of edge and center pixel detectors of the pixelated radiation sensor within 10% of one another.

5 Claims, 13 Drawing Sheets

40

350

↑ hd2

→ hd1

(51) Int. Cl.
    *G01T 1/29*           (2006.01)
    *H10F 39/00*       (2025.01)
    *H10F 39/18*       (2025.01)

(56)             References Cited

U.S. PATENT DOCUMENTS

| | | | |
|---|---|---|---|
| 10,156,644 B2 * | 12/2018 | Ergler | A61B 6/4488 |
| 10,261,196 B2 | 4/2019 | Goederer et al. | |
| 11,169,286 B2 | 11/2021 | Guliyev et al. | |
| 2003/0173523 A1 * | 9/2003 | Vuorela | H10F 39/809 |
| | | | 250/370.13 |
| 2005/0139757 A1 * | 6/2005 | Iwanczyk | G01T 1/2928 |
| | | | 257/E31.015 |
| 2018/0372887 A1 * | 12/2018 | Goederer | H10F 39/811 |
| 2019/0339402 A1 | 11/2019 | Crestani et al. | |
| 2019/0383956 A1 | 12/2019 | Guliyev et al. | |
| 2020/0170593 A1 * | 6/2020 | Ergler | A61B 6/4233 |
| 2023/0243985 A1 | 8/2023 | Bindley et al. | |

OTHER PUBLICATIONS

Ayukawa, M. et al., "Radiation Detector Module Including Application Specific Integrated Circuit With Through-Substrate Vias," U.S. Appl. No. 18/468,891, filed Sep. 18, 2023.

* cited by examiner

RADIATION DETECTOR HAVING IMPROVED EQUALIZATION OF PIXEL RESPONSE

FIELD

The present disclosure relates generally to radiation detectors, and more specifically to pixelated radiation detectors including one or more radiation sensors mounted to an application specific integrated circuit via an interposer and providing improved equalization of pixel response.

BACKGROUND

Room temperature pixelated radiation detectors made of semiconductors, such as cadmium zinc telluride ($Cd_{1-x}Zn_xTe$ where $0<x<1$, or "CZT"), are gaining popularity for use in medical and non-medical imaging. These applications use the high energy resolution and sensitivity of the radiation detectors.

SUMMARY

According to an aspect of the present disclosure, a device includes an interposer configured to electrically connect a pixelated radiation sensor positioned on a front side of the interposer to an application-specific integrated circuit (ASIC) positioned on a back side of the interposer, where the interposer has at least one feature which equalizes the energy resolution (ER) response of edge and center pixel detectors of the pixelated radiation sensor within 10% of one another.

In an embodiment, the at least one feature includes an ASIC connection location on the back side of the interposer that is closer to a peripheral edge of the interposer than a center of the interposer.

In another embodiment, the at least one feature includes a plurality of ASIC connection locations that are laterally spaced from one another on the back side of the interposer.

In another embodiment, the at least one feature includes conductive traces extending between pixel detectors in a central region of the pixelated radiation sensor and corresponding input channels of an ASIC that have a greater length and/or width than conductive traces extending between pixel detectors on an edge of the pixelated radiation sensor and corresponding input channels of an ASIC.

In another embodiment, the at least one feature includes thermal redistribution structures.

In another embodiment, the at least one feature includes strain-relief features.

Further embodiments include X-ray imaging systems including a radiation source configured to emit an X-ray beam, and a detector array including a plurality of the above-described devices that are configured to receive the X-ray beam from the radiation source through an intervening space configured to contain an object therein.

DETAILED DESCRIPTION

Embodiments of the present disclosure provide radiation detector units, detector modules and detector arrays formed by assembling the detector units, and methods of manufacturing the same, the various aspects of which are described herein with reference to the drawings.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Any reference to claim elements in the singular, for example, using the articles "a,"

"an," or "the" is not to be construed as limiting the element to the singular. The terms "example," "exemplary," or any term of the like are used herein to mean serving as an example, instance, or illustration. Any implementation described herein as an "example" is not necessarily to be construed as preferred or advantageous over another implementation. The drawings are not drawn to scale. Multiple instances of an element may be duplicated where a single instance of the element is illustrated, unless absence of duplication of elements is expressly described or clearly indicated otherwise.

Figure 1A:
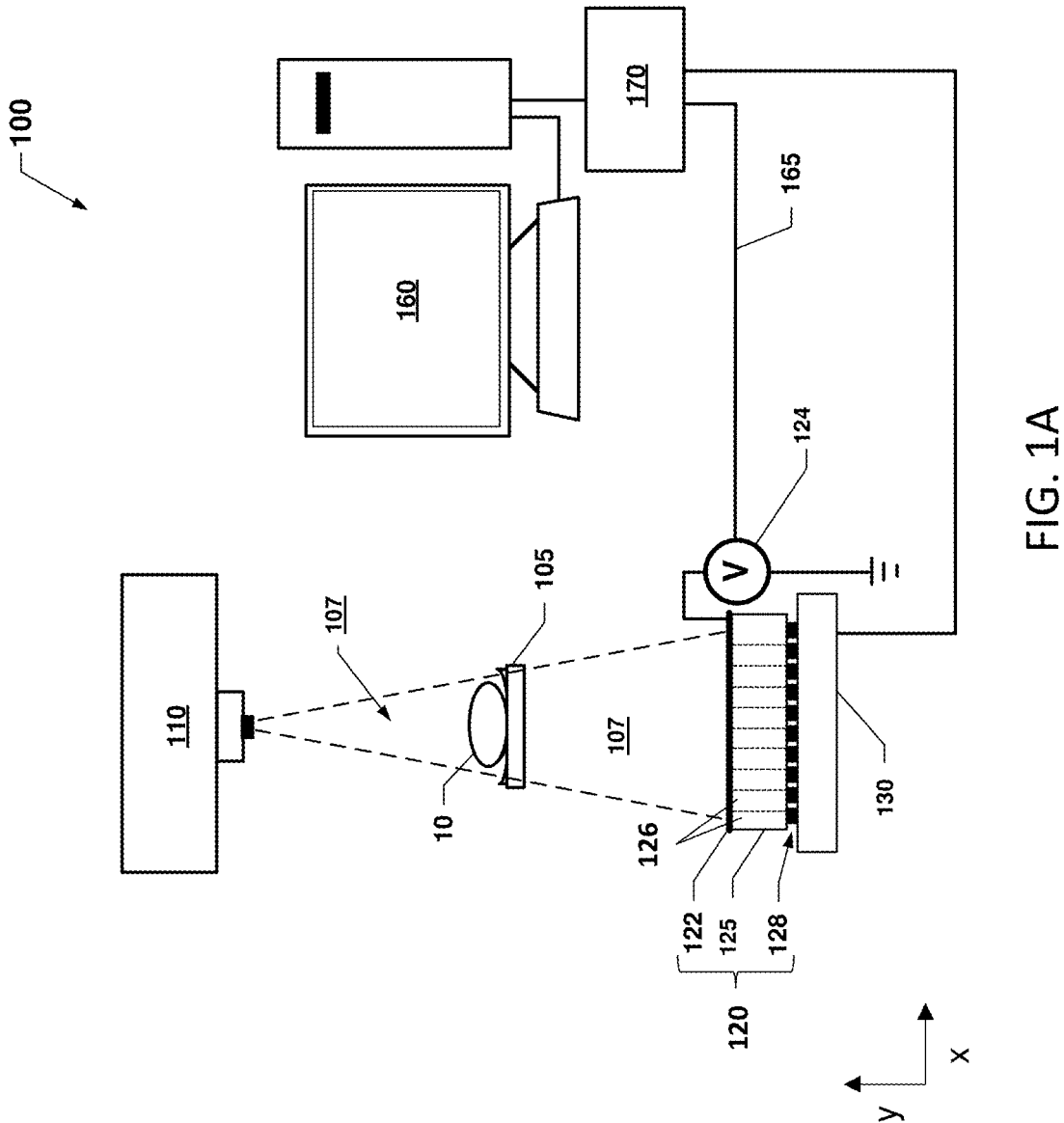
FIG. 1A is a functional block diagram of an X-ray imaging system in accordance with various embodiments of the present disclosure.

FIG. 1A is a functional block diagram of an ionizing radiation imaging system 100 in accordance with various embodiments of the present disclosure. The illustrated ionizing radiation imaging system is an X-ray imaging system 100 that includes an X-ray source 110 (i.e., a source of ionizing radiation), and an energy discriminating photon counting radiation detector 120. The X-ray imaging system 100 may additionally include a patient support structure 105, such as a table or frame, which may rest on the floor and may support an object 10 to be scanned. In some embodiments, the object 10 may be a biologic subject (i.e., a human or animal patient). The support structure 105 may be stationary (i.e., non-moving) or may be configured to move relative to other elements of the X-ray imaging system 100, such as the X-ray source.

The X-ray source 110 is typically mounted to a gantry and may move or remain stationary relative to the object 10. The X-ray source 110 is configured to deliver ionizing radiation to the radiation detector 120 by emitting an X-ray beam 107 toward the object 10 and the radiation detector 120. After the X-ray beam 107 is attenuated by the object 10, the beam of radiation 107 is received by the radiation detector 120.

The radiation detector 120 may be controlled by a high voltage bias power supply 124 that selectively creates an electric field between an anode 128 and cathode 122 pair coupled thereto. In one embodiment, the radiation detector 120 includes a plurality of anodes 128 (e.g., one anode per pixel) and one common cathode 122 electrically connected to the power supply 124 and facing the X-ray source 110. The radiation detector 120 may include a detector material 125, such as a semiconductor material disposed between the anode 128 and cathode 122 and thus configured to be exposed to the electrical field therebetween. The semiconductor material may comprise any suitable semiconductor material for detecting X-ray radiation disposed between the anode 128 and cathode 122 and thus configured to be exposed to the electrical field therebetween. In various embodiments, the semiconductor material of the radiation detector 120 may comprise a II-VI semiconductor material, such as cadmium telluride, cadmium zinc telluride (i.e., CdZnTe or "CZT"), cadmium selenide telluride, and cadmium zinc selenide telluride. Other suitable semiconductor materials are within the contemplated scope of disclosure.

A read-out application specific integrated circuit (ASIC) 130 coupled to the anode(s) 128 may receive signals (e.g., charge or current) from the anode 128(s) and be configured to provide data to and by controlled by a control unit 170. The radiation detector 120 may be segmented or configured into a large number of small "pixel" detectors 126. In various embodiments, the pixel detectors 126 of the radiation detector 120 and the ASIC 130 are configured to output data that includes counts of photons detected in each pixel detector in each of a number of energy bins. Thus, radiation detectors 120 of various embodiments provide both two-dimensional detection information regarding where photons were detected, thereby providing image information, and measurements of the energy of the detected X-ray photons. A radiation detector 120 that is capable of measuring the energy of the X-ray photons impinging on the detector 120 may be referred to as an energy-discriminating radiation detector 120.

The control unit 170 may be configured to synchronize the X-ray source 110, the read-out ASIC 130, and the high voltage bias power supply 124. The control unit 170 may be coupled to and operated from a computing device 160. Alternatively, the computing device 160 and the control unit 170 may be integrated together as one device.

In some embodiments, the X-ray imaging system 100 may be a computed tomography (CT) imaging system. The CT imaging system 100 may include a gantry (not shown in FIG. 1A), which may include a moving part, such as a circular, rotating frame with the X-ray source 110 mounted on one side and the radiation detector 120 mounted on the other side. The radiation detector 120 may have a curved shape along its long axis (i.e., the x-axis direction in FIG. 1A) such that each of the pixel detectors along the length of the radiation detector may face towards the focal spot of the X-ray source 110. The gantry may also include a stationary (i.e., non-moving) part, such as a support, legs, mounting frame, etc., which rests on the floor and supports the moving part. The X-ray source 110 may emit a fan-shaped or cone-shaped X-ray beam 107 as the X-ray source 110 and the radiation detector 120 rotate on the moving part of the gantry around the object 10 to be scanned. After the X-ray beam 107 is attenuated by the object 10, the X-ray beam 107 is received by the radiation detector 120. The curved shape of the radiation detector 120 may allow the CT imaging system 100 to create a 360° continuous circular ring of the image of the object 10 by rotating the moving part of the gantry around the object 10.

For each complete rotation of the X-ray source 110 and the radiation detector 120 around the object 10, one cross-sectional slice of the object 10 may be acquired. As the X-ray source 110 and the radiation detector 120 continue to rotate, the radiation detector 120 may take numerous snapshots called "views". Typically, about 1,000 profiles are taken in one rotation of the X-ray source 110 and the radiation detector 120. The X-ray source 110 and the detector 120 may slowly move relative to the patient along a horizontal direction (i.e., into and out of the page in FIG. 1A) so that the detector 120 may capture incremental cross-sectional profiles over a region of interest (ROI) of the object 10, which may include the entire object 10. The data acquired by the radiation detector 120 and output by the read-out ASIC 130 may be passed along to the computing device 160 that may be located remotely from the radiation detector 120 via a connection 165. The connection 165 may be any type of wired or wireless connection. If the connection 165 is a wired connection, the connection 165 may include a slip ring electrical connection between any structure (e.g., gantry) supporting the radiation detector 120 and a stationary support part of the support structure, which supports any part (e.g., a rotating ring). If the connection 165 is a wireless connection, the radiation detector 120 may contain any suitable wireless transceiver to communicate data with another wireless transceiver that is in communication with the computing device 160. The computing device 160 may include processing and imaging applications that analyze each profile obtained by the radiation detector 120, and a full set of profiles may be compiled to form a three-dimensional computed tomographic (CT) reconstruction of the object 10 and/or two-dimensional images of cross-sectional slices of the object 10.

Various alternatives to the design of the X-ray imaging system 100 of FIG. 1A may be employed to practice embodiments of the present disclosure. X-ray imaging systems may be designed in various architectures and configurations. For example, an X-ray imaging system may have a helical architecture. In a helical X-ray imaging scanner, the X-ray source 110 and radiation detector 120 are attached to a freely rotating gantry. During a scan, a table moves the object 10 smoothly through the scanner, or alternatively, the X-ray source 110 and detector 120 may move along the length of the object 10, creating helical path traced out by the X-ray beam. Slip rings may be used to transfer power and/or data on and off the rotating gantry. In other embodiments, the X-ray imaging system may be a tomosynthesis X-ray imaging system. In a tomosynthesis X-ray scanner, the gantry may move in a limited rotation angle (e.g., between 15 degrees and 60 degrees) in order to detect a cross-sectional slice of the object 10. The tomosynthesis X-ray scanner may be able to acquire slices at different depths and with different thicknesses that may be reconstructed via image processing.

Figure 1B:
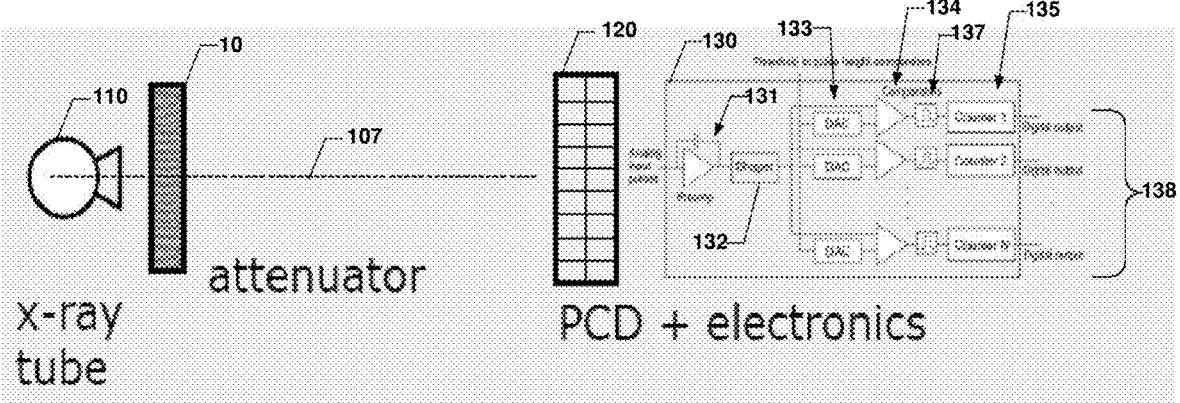
FIG. 1B is a schematically illustration of an application specific integrated circuit (ASIC) configured to count X-ray photons detected in each pixel detector within a set of energy bins according to various embodiments of the present disclosure.

FIG. 1B illustrates components of an X-ray imaging system, including components within the ASIC 130 configured to count X-ray photons detected in each pixel detector within a set of energy bins. As used herein, the terms "energy bin" and "bin" refer to a particular range of measured photon energies between a minimum energy threshold and a maximum energy threshold. For example, a first bin may refer to counts of photons determined to have an energy greater than a threshold energy (referred to as a trigger threshold, e.g., 20 keV) and less than 40 keV, while a second bin may refer to counts of photons determined to have an energy greater than 40 keV and less than 60 keV, and so forth.

X-rays 107 from an X-ray source (e.g., X-ray tube) 110 may be attenuated by a target (e.g., an object 10, such as a human or animal patient) before interacting with the radiation detector material within the pixelated detector array 120. An X-ray photon interacting (e.g., via the photoelectric effect) with a pixelated radiation detector material generates an electron cloud within the material that is swept by an electric field to the anode electrode 128. The charge gathered on the anode creates a signal that is integrated by a charge sensitive amplifier (CSA) 131. There may be a CSA 131 for each pixel detector (e.g., for each anode 128) within the pixelated X-ray detector 120. The voltage of the CSA output signal may be proportional to the energy of the X-ray photon. The output signal of the CSA may be processed by an analog filter or shaper 132.

The filtered output may be connected to the inputs of a number of analog comparators 134, with each comparator connected to a digital-to-analog converter (DAC) 133 that inputs to the comparator a DAC output voltage that corresponds to the threshold level defining the limits of an energy bin. The detector circuitry 130 may be configured so that after the CSA voltage has stabilized (after the dead time), that voltage may be between two voltage thresholds set by two DACs 133, which determines the output of the comparators 134. Outputs from the comparators 134 may be processed through decision gates 137, with a positive output from a comparator 134 corresponding to a particular energy bin (defined by the DAC output voltages) resulting in a count added to an associated counter 135 for the particular energy bin. Periodically, the counts in each energy bin counter 135 are output as signals 138 to the control unit 170.

The detector array of an X-ray imaging system may include an array of radiation detector elements, referred to herein as pixel detectors. The signals from the pixel detectors may be processed by a pixel detector circuit, which may sort detected photons into energy bins based on the energy of each photon or the voltage generated by the received photon. When an X-ray photon is detected, its energy is determined and the X-ray photon count for its associated energy bin is incremented. For example, if the detected energy of an X-ray photon is 24 kilo-electron-volts (keV), the X-ray photon count for the energy bin of 20-40 keV may be incremented. The number of energy bins may be three or more, such as four to twelve. In an illustrative example, an X-ray photon counting detector may have four energy bins: a first bin for detecting photons having an energy between 20 keV and 40 keV, a second bin for detecting photons having an energy between 40 keV and 60 keV, a third bin for detecting photons having an energy between 60 keV and 90 keV, and a fourth bin for detecting photons having an energy above 90 keV (e.g., between 90 keV and 120 keV). The greater the total number of energy bins, the better the material discrimination. The total number of energy bins and the energy range of each bin may be selectable by a user, such as by adjusting the threshold levels defining the limits of the respective energy bins in the read-out ASIC 130 as shown in FIG. 1B.

In various embodiments, a radiation detector 120 for an X-ray imaging system 100 as described above may include a detector array including a plurality of pixel detectors 126 extending over a continuous two-dimensional (2D) detector array surface. The detector array (which is also known as a detector module system (DMS)) may include a modular configuration including a plurality of detector modules, where each detector module may include at least one radiation sensor (e.g., a detector material 125 including cathode and anode electrode(s) 122, 128 defining pixel detectors 126 as described above), at least one ASIC 130 (also known as a read-out integrated circuit (ROIC)) electrically coupled to the at least one radiation sensor, and a module circuit board. The module circuit board may support transmission of electrical power, control signals, and data signals between the module circuit board and the at least one ASIC 130 and the at least one radiation sensor of the detector module, and may further support transmission of electrical power, control signals, and data signals between the module circuit board and the control unit 170 of the X-ray imaging system 100, other module circuit boards of the detector array, and/or a power supply for the detector array. A plurality of detector modules may be assembled on a common support structure, such as a detector array frame, to form a detector array.

Figure 2:
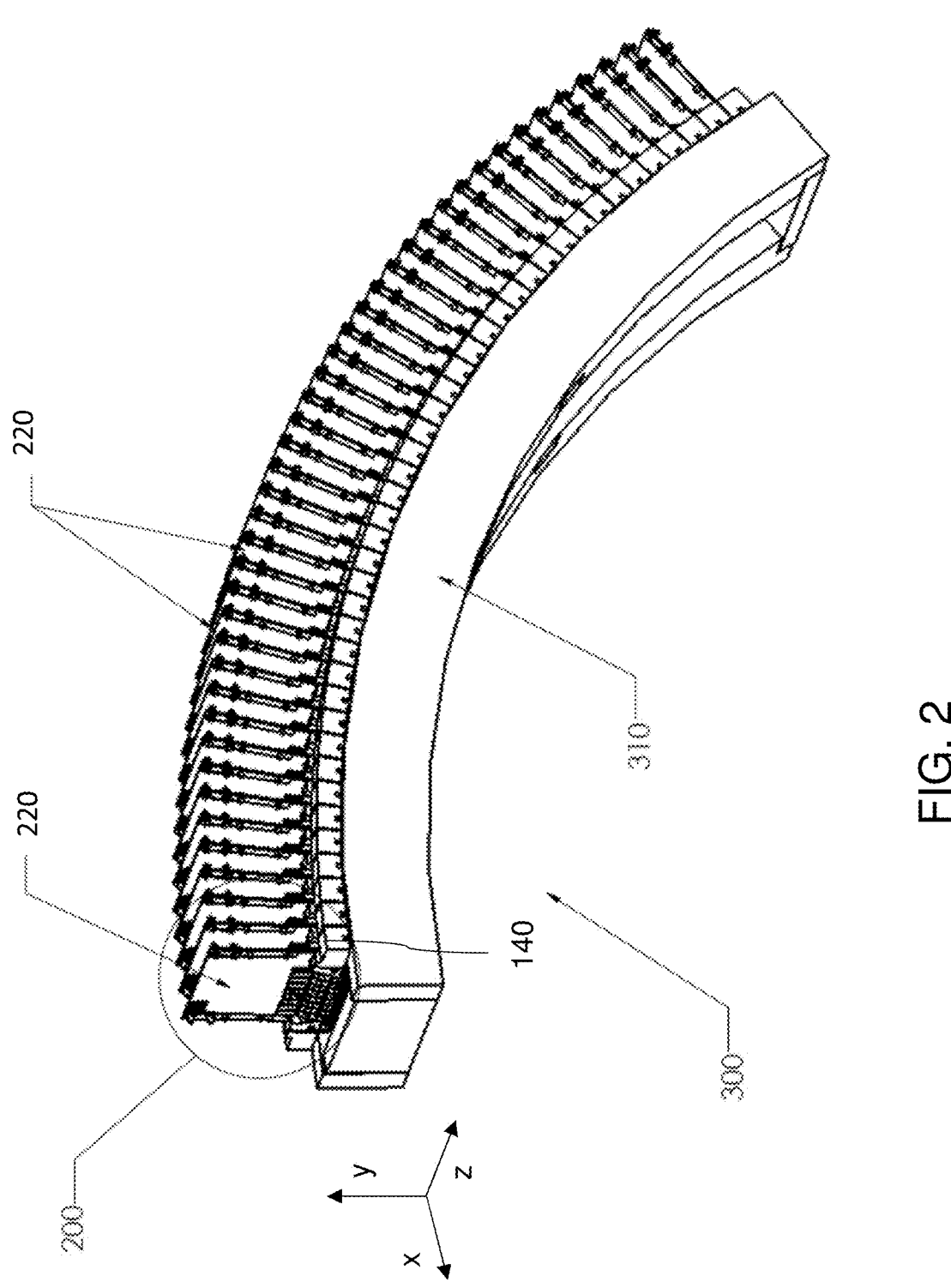
FIG. 2 is a perspective view of a detector array for a computed tomography (CT) X-ray imaging system according to various embodiment of the present disclosure.

FIG. 2 is a perspective view of a detector array 300 for a computed tomography (CT) X-ray imaging system according to various embodiment of the present disclosure. The detector array 300 in this embodiment includes multiple detector modules 200 mounted on a detector array frame 310. The detector array frame 310 may be configured to provide attachment of a row of detector modules 200 such that physically exposed surfaces of the radiation sensors of the detector modules 200 collectively form a curved detection surface located within a cylindrical surface. The multiple detector modules 200 may be assembled such that radiation sensors attached to neighboring detector modules 200 abut each other, i.e., make direct surface contact with each other and/or include a gap between adjacent radiation sensors that is less than 3 mm, and/or less than 2 mm, and/or less than 1 mm in the x-direction. In some embodiments, the detector modules 200 may be mounted to the detector array frame 310 by attaching frame bars 140 of the detector modules 200 to the detector array frame 310 using suitable mechanical fasteners. The radiation sensors and ASICs 130 of each module 200 may be mounted over a first (i.e., front) surface of the frame bar 140. Each module 200 may also include a module circuit board 220 extending away from a rear surface of the frame bar 140. Major surfaces of the module circuit boards 220 of the detector modules 200 may face each other in the detector array 300.

Figure 3A:
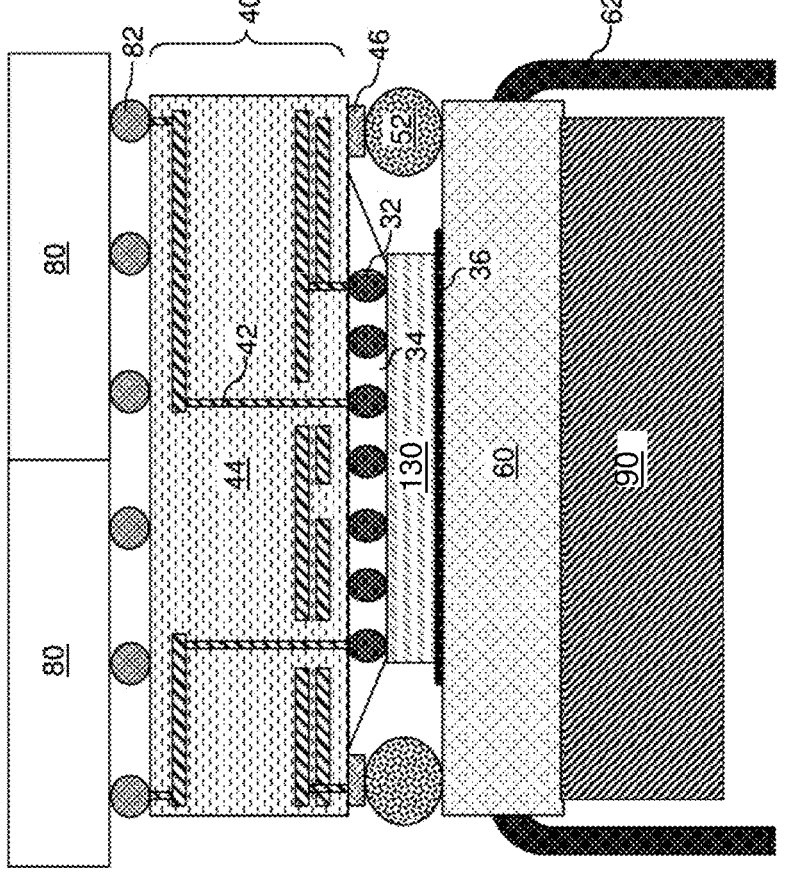
FIG. 3A is a vertical cross-sectional view of a radiation detector unit according to one embodiment of the present disclosure.

In some embodiments, each of the detector modules 200 of a detector array 400 may be constructed from a set of radiation detector units, which may also be referred to as "mini-modules" or "submodules." In some embodiments, each of the radiation detector units may include one or more radiation sensors coupled to a single ASIC 130. FIG. 3A is a vertical cross-sectional view of a radiation detector unit 210 according to one embodiment of the present disclosure. Referring to FIG. 3A, the radiation detector unit 210 includes a pair of radiation sensors 80, an ASIC 130, and an interposer 40 disposed between the radiation sensors 80 and the ASIC 130. The interposer 40 includes an insulating interposer matrix 44, which may include semiconductor (e.g., undoped or low doped semiconductor), glass, polymer (e.g., printed circuit board insulating laminate) or ceramic material, and a plurality of conductive (e.g., metal) interconnect structures 42 embedded within the insulating interposer matrix 44. Bonding pads (not expressly shown) may be located on the front side and the backside of the interposer 40 and may be electrically coupled to the conductive interconnect structures 42. As used herein, the "front side" of elements refers to the side that faces the incoming radiation, and the "backside" of elements refers to the side that is the opposite side of the front side.

The ASIC 130 may interface with external components through bonding pads that are located on the front side of the ASIC 130. The bonding pads may include input pads, output pads, and power pad(s). The bonding pad(s) of the ASIC 130 can be arranged as an array, such as a rectangular array. At least a portion of the bonding pads on the backside of the interposer 40 may have the same periodicity as the bonding pads on the front side of the ASIC 130.

Each of the radiation sensors 80 may have bonding pads located on the backside of the radiation sensor 80. The bonding pads on the backside of the radiation sensors 80 may be arranged as an array, such as a rectangular array. The front side bonding pads of the interposer 40 may have the same periodicity as the periodicity of bonding pads on the backside of the radiation sensors 80.

Referring again to FIG. 3A, the ASIC 130 may be mounted to the backside of the interposer 40 through an array of first bonding structures 32, such as solder balls or copper pillars. Specifically, the array of first bonding structures 32, may be bonded to a respective pair of a bonding pads on the front side of the ASIC 20 and a backside bonding pad of the interposer 40 employing a flip-chip bonding process (e.g., a C4 bonding process and/or a thermo-compression process in embodiments using copper pillar bonding structures). An insulating matrix 34 may be formed around the array of first bonding structures 32 to structurally reinforce the array of first bonding structures 32. While a configuration in which one ASIC 130 is bonded to the backside of the interposer 40 is illustrated herein, two or more ASICs 130 may be bonded to the backside of the interposer 40 in some embodiments. At least one radiation sensor 80 may be bonded to the front side of the interposer 40 via bonding material portions 82. In some embodiments, the bonding material portions 82 may include a low temperature solder material or conductive epoxy. In one embodiment, the at least one radiation sensor 80 includes a pair of radiation sensors 80 having a respective rectangular shape and adjoined to each other with no gap or with a gap less than 3 mm, and/or less than 2 mm, and/or less than 1 mm. X-ray photon detection signals from the radiation sensors 80 may be transmitted to the ASIC 130 via the interposer 40. The ASIC 130 may be configured to convert event detection signals from the at least one radiation sensor 80 to digital detection signals, which can include the pixel location and the energy range of the detected radiation.

The radiation detector unit 210 may further include a carrier board 60 and at least one flex cable assembly 62, which are configured to route power supply to the ASIC 130 and to the at least one radiation sensor 80, control signals to the ASIC 130, and data signals (e.g., digital detection signals) generated by the ASIC 130 and transmitted through the interposer 40. One end of each flex cable assembly 62 may be attached to a respective side of the carrier board 60, and another end of each flex cable assembly may be connected to a module circuit board 220 as shown in FIG. 2. The carrier board 60 may be a printed circuit board including an insulating substrate and printed interconnection circuits. A thermally conductive paste 36, such as a silver paste layer, may be provided between the backside of the ASIC 130 and the front side of the carrier board 60. An array of second solder balls 52 may each be bonded to a bonding pad 46 on the backside of the interposer 40 and a corresponding bonding pad (not expressly shown in FIG. 3A) on the front side of the carrier board 60. The second solder balls 52 may be located around and laterally spaced away from peripheral side surfaces of the ASIC 130. Each flex cable assembly 62 may include signal wires and power wires. The signal wires are configured to transmit the electronic detection signals and control signals, and the power wires are configured to provide electrical power to the interposer 40, which distributes the electrical power to the ASIC 130 and the radiation sensor(s) 80. In some embodiments, the flex cable assembly 62 can be more flexible (i.e., can bend with a lower application of force) than the carrier board 60.

The radiation sensors 80, the interposer 40, the ASIC 130 and the carrier board 60 may be mounted to a supporting substrate (e.g., a block) 90 as shown in FIG. 3A. The supporting substrate may include a high thermal conductivity material such as a metal (e.g., aluminum, copper, etc.). The supporting substrate 90 may function as a heat sink for the radiation detector unit 210. The supporting substrate 90 may be attached to the backside of the carrier board 60 using a thermally conductive adhesive such as a thermally conductive paste, and/or by mechanical connection structures (such as snap-in connectors, screws, and/or bolts and nuts).

Figure 3B:
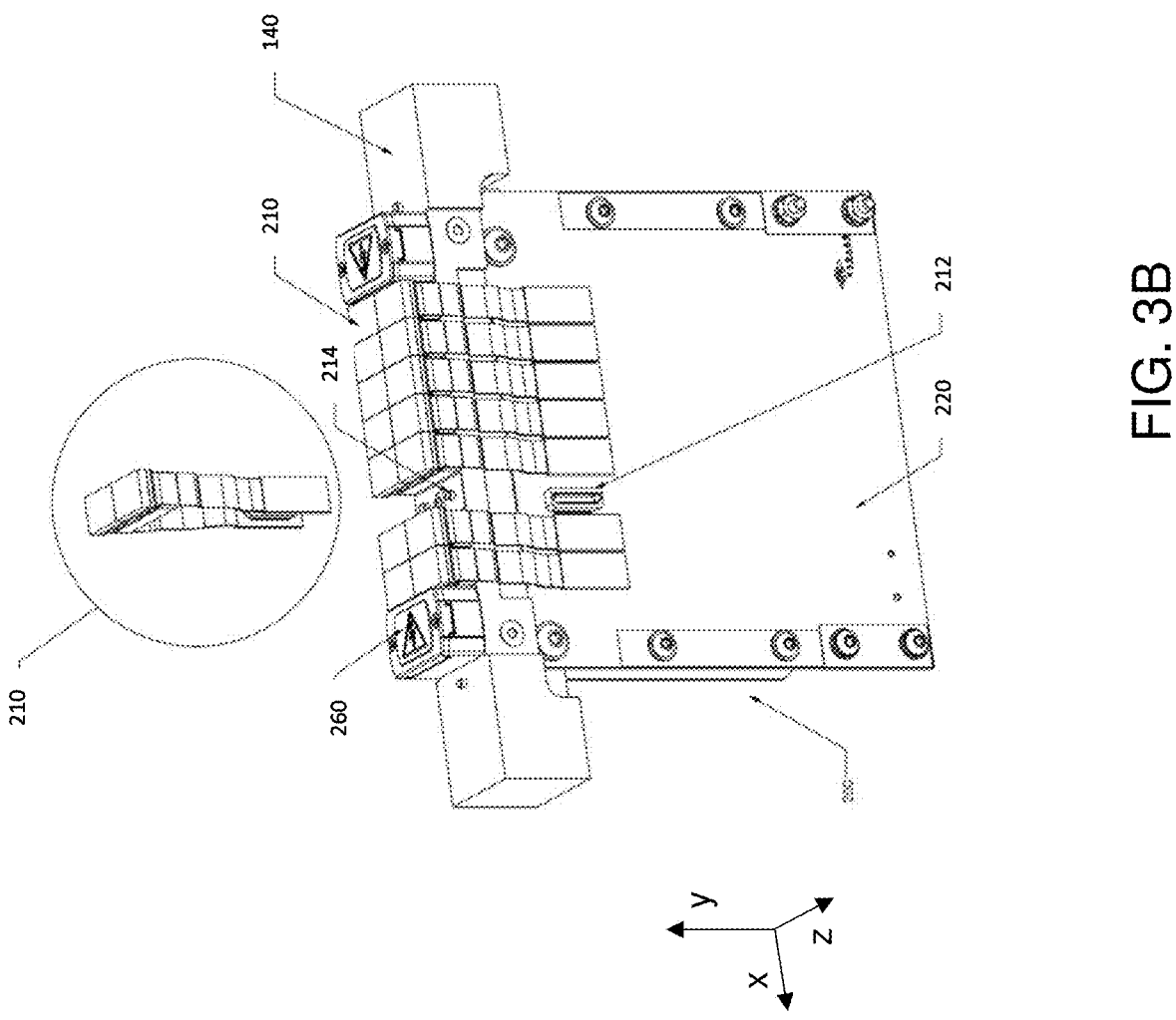
FIG. 3B is a perspective view of a detector module including a plurality of radiation detector units mounted to a frame bar according to various embodiments of the present disclosure.

FIG. 3B is a perspective view of a detector module 200 including a plurality of radiation detector units 210 mounted to an above-described frame bar 140. Referring to FIG. 3B, a row of radiation detector units 210 may be mounted to the front side of the frame bar 140. Engagement features 214 may optionally be provided on the front side of the frame bar 140 that may made with corresponding engagement features (not shown) on the backside of the supporting substrate 90 of each of the radiation detector units 210. End holders 260 may optionally be located at either end of the row of radiation detector units 210. A module circuit board 120 may be mechanically coupled to the frame bar 140 by suitable mechanical fastener(s). Each radiation detector unit 210 of the detector module may be electrically coupled to the module circuit board 220 by a flex cable assembly 62. In the embodiment shown in FIG. 3B, the module circuit board 220 may include board-side connectors 212, where each board-side connector 212 may be connected to a connector, such as a snap-in connector 66, of a respective flex cable.

A radiation detector unit 210 and/or a detector module 200 as described above may have non-uniformities in the responses of different pixel detectors 126 of the array of pixel detectors 126. These non-uniformities in the detector pixel response may include variations in pixel performance with respect to a number of key detector parameters, such as energy resolution (ER) and/or noise (e.g., equivalent noise charge (ENC)). The energy resolution (ER) is a particularly significant parameter for energy-discriminating photon counting radiation detectors. In the case of imaging applications including readouts of high-flux photon counts in multiple energy bins, such as in photon counting computed tomography (PCCT), the ER determines how well the energy bins are resolved, e.g., how clean is the separation between adjacent energy bins along the energy spectrum. The smaller the ER, the better the performance of the radiation detector. In practice, ER values between about 4 keV and about 10 keV are achievable. Furthermore, the more uniform the ER values are across different regions of the radiation detector the better the quality of the resulting images.

One prior art approach for compensating for non-uniformity in detector pixel response is to correct for these non-uniformities within the detector read-out electronics (i.e., the ASIC). For example, U.S. Pat. No. 10,261,196 to Goederer et al. describes a technique that includes modifying the capacitance within the read-out ASIC so that the capacitance across all the ASIC channels is equalized.

Many of the techniques for compensating for non-uniform pixel response that are implemented solely in the read-out electronics (i.e., the ASIC) neglect that non-uniformities in detector pixel response are a function of the entire design of the radiation detector, including the structure and characteristics of each of the constituent components of the radiation detector and how those components are integrated and combined to provide the finished radiation detector. In the case of a radiation detector unit 210 and/or a detector module 210 as described above, the design and characteristics of the radiation sensor(s) 80, the interposer 40 and ASIC 130 may each contribute to non-uniformities in the detector pixel response. Some of the non-uniformities in the detector pixel response may be the result of differences in the input capacitance as seen by the pixel sensing electronics. These differences in the input capacitance may be largely a function of the design of the interposer 40 and the manner in which the interposer 40 routes signals from each of the pixel detectors 126 to an input channel of the ASIC 130. In addition, some of the non-uniformities in the detector pixel response may result from characteristics of the radiation sensor 80. In particular, in direct conversion semiconductor radiation sensors 80, such as CZT radiation sensors 80, the pixel detectors 126 exhibiting the worst pixel response characteristics (e.g., the pixel detectors 126 having the highest ER) tend to be located near the edges of the radiation sensor 80 while the pixel detector 126 closer to the center of the radiation sensor 80 exhibit relatively better performance (e.g., lower ER). This may be the result of distortions of the electric field along the edges of the radiation sensor 80, which can be caused by imperfect or lack of passivation along the exposed semiconductor crystal walls and/or damage incurred during the wafer dicing process. In addition, the pixel sensors 126 along the edges of the radiation sensor 80 are often smaller than other pixel sensors 126 of the radiation sensor 80 in order to maintain consistent center-to-center pixel spacing when multiple abutting radiation sensors 80 are assembled into a larger-area array. Other factors, such as thermal non-uniformities across the radiation sensor 80 and/or strain-induced non-uniformities at the interposer/radiation sensor interface may also contribute to non-uniformity in the detector pixel response.

Various embodiments include providing a radiation detector unit 210 including an interposer 40 configured to electrically connect a pixelated radiation sensor 80 positioned on a front side of the interposer 40 to an ASIC 130 positioned on a back side of the interposer 40, where the interposer 40 has at least one feature which equalizes the energy resolution (ER) response of edge and center pixel detectors 126 of the pixelated radiation sensor within 10% of one another, such as within 0 to 5% of one another. In some embodiments, the at least one feature includes an ASIC connection location on the interposer 40 that is closer to a peripheral edge of the interposer 40 than a center of the interposer 40. This may facilitate relatively longer conductive path lengths through the interposer 40 for center pixel detectors 126 and relatively shorter conductive path lengths through the interposer 40 for edge pixel detectors 126 which may help to equalize the ER response between the center pixel detectors 126 and the edge pixel detectors 126. In some embodiments, interposer 140 may include a plurality of ASIC connection locations that are laterally spaced from one another on the back side of the interposer 40, such that a plurality of ASICs 40 may be coupled to the interposer 40 to provide a distributed detector read-out circuitry configuration. The size(s) and/or location (s) of the ASIC connection locations and the plurality of ASICs 130 mounted thereto may be optimized to provide relatively shorter conductive path lengths through the interposer 40 between the radiation sensor 80 and the ASIC 130 for edge pixel detectors 126 and relatively longer conductive path lengths for center pixel detectors 126 to provide improved equalization of ER response across the radiation detector unit 210.

In some embodiments, the at least one feature includes conductive traces (i.e., interconnect structures 42) extending through the interposer 40 between pixel detectors 126 in a central region of the pixelated radiation sensor 80 and corresponding input channels of an ASIC 130 that have a greater length and/or width than conductive traces extending between pixel detectors 126 on an edge of the pixelated radiation sensor 80 and corresponding input channels of an ASIC 130. In still further embodiments, the at least one feature includes thermal redistribution structures within the interposer 40, such as laterally-extending thermal traces, that are configured to provide a more uniform temperature profile in the radiation sensor 80. In still further embodiments, the at least one feature includes strain-relief features, such as vias extending through the interposer 40, that are configured to reduce warping at the interface between the interposer 40 and the radiation sensor 80.

Figures 4A, 4B:
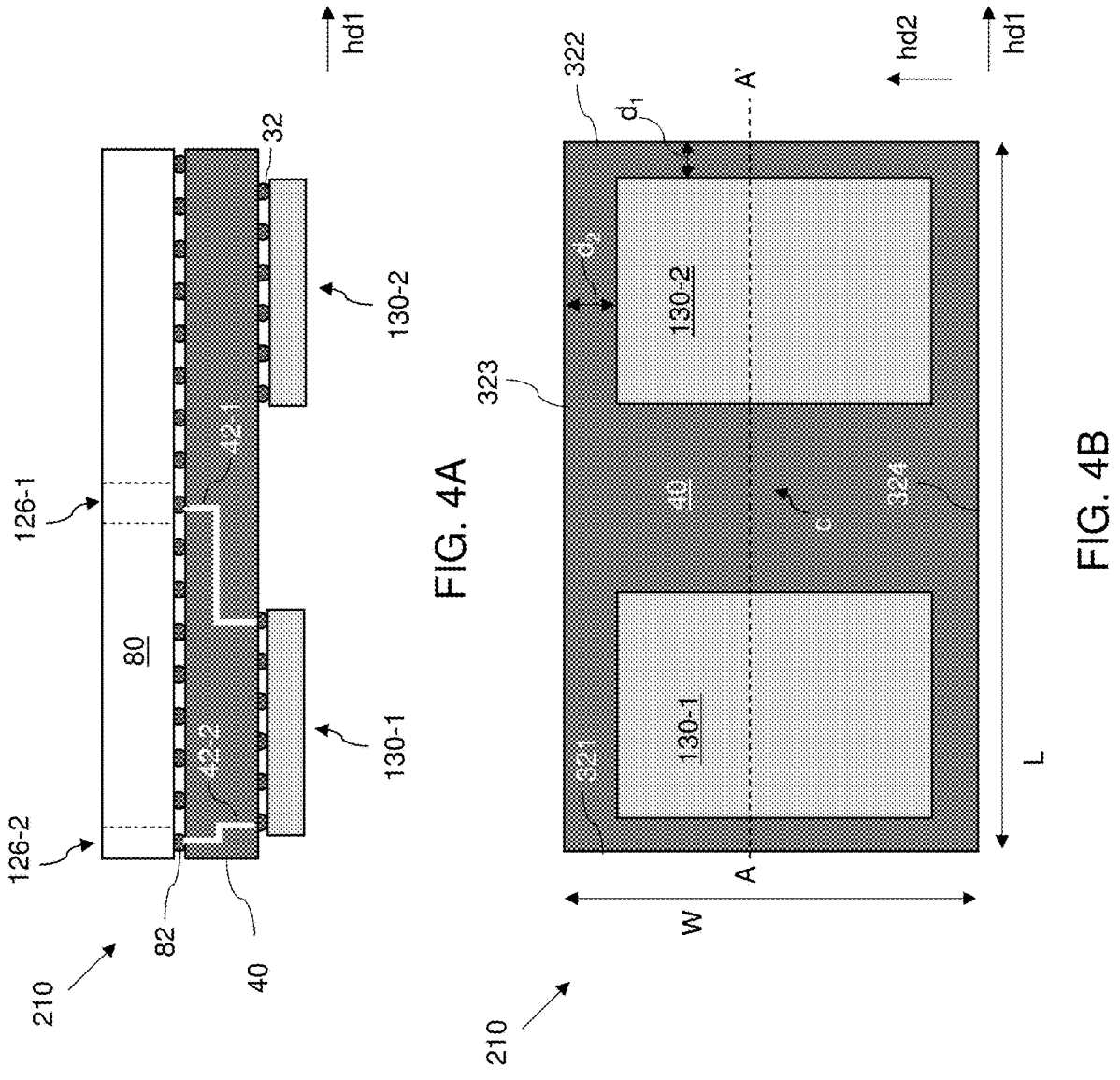
FIG. 4A is a vertical cross-section view of a portion of a radiation detector unit according to an embodiment of the present disclosure.
FIG. 4B is a bottom view of the portion of the radiation detector unit of FIG. 4A.

FIG. 4A is a vertical cross-section view of a portion of a radiation detector unit 210 according to an embodiment of the present disclosure. FIG. 4B is a bottom view of the portion of the radiation detector unit 210 of FIG. 4A. The vertical cross-section view of FIG. 4A is taken along line A-A' in FIG. 4B. Referring to FIGS. 4A and 4B, the radiation detector unit 210 may include an interposer 40 having at least one radiation sensor 80 mounted over a front side of the interposer 40 via a plurality of above-described bonding material portions 82, and a plurality of ASICs 130 mounted to the back side of the interposer 40 via a plurality of above-described first bonding structures 32. It will be understood that the radiation detector unit 210 may include additional features, such as an above-described carrier board 60 located on the back side of the plurality of ASICs 130, a plurality of above-described second solder balls 52 located between bonding pads on the back side of the interposer 40 and corresponding bonding pads on the front side of the carrier board 60, an above-described flex cable assembly 62 attached to the carrier board 60, and an above-described supporting substrate 90. For clarity of illustration, a carrier board 60, second solder balls 52, a flex cable assembly 62 and a supporting substrate 90 are not shown in the radiation detector unit 210 of FIGS. 4A and 4B.

In various embodiments, the read-out circuitry of the radiation detector unit 210 may have a distributed configuration in which the interposer 40 includes a plurality of ASIC connection locations on the back side of the interposer 40 that are laterally-spaced from one another. A plurality of discrete ASICs 130 may be mounted to the ASIC connection locations on the back side of the interposer 40, where each of the ASICs 130 may be electronically-coupled to a subset of the pixel detectors 126 of a radiation sensor 80 by conductive interconnect structures 42 within the interposer 40. Such a configuration may reduce variations in the lengths of the conductive interconnect structures 42 (which may also be referred to as conductive traces 42) that connect each of the pixel detectors 126 to a corresponding input channel of an ASIC 130. Additionally or alternatively, the configuration reduce lengths of the conductive interconnect structures 42 from the poorer performing edge pixel detectors 126 to the ASIC 130. This reduces the capacitance of such interconnect structures 42 and results in a more uniform ER distribution between the edge and central pixel detectors 126.

In particular, the input capacitance seen at each of the input channels of the ASIC 130 is related in part to the overall length of the conductive traces 42 that route the detection signals from the pixel detector 126 of the radiation sensor 80 through the interposer 40 to the corresponding input channel of the ASIC 130. Longer lengths of the conductive traces 42 result in a higher parasitic capacitance through the interposer 40 contributing to a higher input capacitance at the input channel of the ASIC 130. In a conventional radiation detector unit, a single ASIC 130 is often mounted in the center of the interposer 40 underlying the central region of the radiation detector 80, such as shown in FIG. 3A. This means that the pixel detectors 126 closest to the center of the radiation detector 80 normally have the shortest routing length to the corresponding input channels of the ASIC 130, while the pixel detectors 126 near the edge(s) of the radiation detector 80 have the longest routing lengths to the corresponding input channels of the ASIC 130. However, as discussed above, the pixel detectors 126 located near the edge(s) of the radiation detector 80 tend to have the poorest pixel response characteristics. Thus, a configuration in which the poorest-performing pixels have the longest routing lengths, and thus the highest added parasitic capacitance, while the best performing pixels have the shortest routing lengths, and thus the lowest added parasitic capacitance, may exacerbate the variation in pixel response (e.g., ER values) across the radiation sensor 80, which may result in poor image quality and image artifacts.

In various embodiments, the plurality of ASICs 130 may be mounted to the back side of the interposer 40 in a configuration that may promote equalization of the pixel response characteristics by controlling the parasitic capacitance added to each of the pixel read-out signals due to variations in signal routing lengths. In particular, the locations, size(s) and/or number of ASICs 130 mounted to the interposer 40 may be configured to provide relatively shorter signal routing lengths for pixel detectors 126 located near an edge of a radiation sensor 80 and relatively longer signal routing lengths for pixel detectors 126 located near the center of a radiation sensor 80. This is schematically illustrated in FIG. 3A, which shows a first pixel detector 126-1 located near the center of the radiation detector 80 that is coupled to an ASIC 130 via a first set of conductive interconnect structures 42-1 and a second pixel detector 126-2 located near the edge of the radiation detector 80 that is coupled to the ASIC 130 via a second set of conductive interconnect structures 42-2. The overall length of the second set of conductive interconnect structures 42-2 is less than the overall length of the first set of conductive interconnect structures 42-1. Accordingly, less parasitic capacitance is added to the output signals from the second pixel detector 126-2 than is added to the output signals from the first pixel detector 126-1. The additional parasitic capacitance that is added to pixel detectors 126 (e.g., central pixel detectors 126-1) located near the center of the radiation sensor 80 may result in some degradation in the pixel response characteristics, such as the energy resolution (ER), of the pixel detectors 126 located near the center of the radiation sensor 80. However, the overall variation in pixel response characteristics across all of the pixel detectors 126 of the radiation sensor may be reduced, which may improve overall image quality of the images obtained using the radiation detector unit 210.

FIGS. 4A and 4B illustrate an exemplary layout of the plurality of ASICs 130 mounted to the back side of the interposer 40 according to an embodiment of the present disclosure. In various embodiments, the dimensions of the interposer 40 may generally correspond to the dimensions of the radiation sensor(s) 80 mounted over the front side of the interposer 40. In some embodiments, the dimensions of the interposer 40 along respective orthogonal horizontal directions hd1 and hd2 may be substantially equal (e.g., within ±5%, such as ±0 to 2%) to the dimensions of the radiation sensor(s) 80 mounted to the interposer 40 along the same horizontal directions hd1 and hd2. In the embodiment of FIGS. 3A and 3B, a single radiation sensor 80 having a rectangular shape is mounted over the front side of the interposer 40. The interposer 40 has a length dimension L that is substantially equal to the length dimension of the radiation sensor 80, and a width dimension W that is substantially equal to the width dimension of the radiation sensor 80. In other embodiments, multiple radiation sensors 80 may be mounted to the front side of the interposer 40, such that the length L and width W dimensions of the interposer 40 may be equal to the combined length and width dimensions of the multiple radiation sensors 80 along the same horizontal directions hd1 and hd2. In embodiments in which multiple radiation sensors 80 having identical sizes are mounted to the front side of the interposer 40 the length L and width W dimensions of the interposer 40 may each be an integer multiple of the corresponding length and width dimensions of the radiation sensors 80.

In the embodiment of FIGS. 4A and 4B, a pair of ASICs 130 are mounted to the back side of the interposer 40. Each of the ASICs 130 may be laterally offset from the center of the interposer 40 (indicated by the arrow labeled "c" in FIG. 3B). Thus, a first ASIC 130-1 may be located on a first side of the interposer 40 that is adjacent to a first peripheral edge 321 of the interposer 40, and a second ASIC 130-2 may be located on a second side of the interposer 40 that is adjacent to a second peripheral edge 322 that is opposite the first peripheral edge 321. In the embodiment of FIGS. 3A and 3B, the first peripheral edge 321 and the second peripheral edge 322 of the interposer 40 may both extend along the relatively shorter horizontal dimension hd2 (i.e., the width dimension W) of the rectangularly-shaped interposer 40. Each of the ASICs 130-1 and 130-2 may have a first minimum offset distance, $d_1$, between a peripheral edge of the ASIC 130-1, 130-2 and the first or second peripheral edge 321, 322 of the interposer 40 that is closest to the respective ASIC 130-1, 130-2. The interposer 40 may further include a third peripheral edge 323 and a fourth peripheral edge 324 extending parallel to one another along the relatively longer horizontal dimension hd1 (i.e., the length dimension L) of the interposer 40. Each of the ASICs 130-1 and 130-2 may have a second minimum offset distance, $d_2$, between a peripheral edge of the ASIC 130 and the third peripheral edge 323 and the fourth peripheral edge 324 of the interposer 40.

In some embodiments, the first minimum offset distance, $d_1$, may be less than the second minimum offset distance, $d_2$. In other words, each of the ASICs 130 may extend closer to a peripheral edge 321, 322 of the interposer 40 along a short side of the interposer 40 than to the peripheral edge 323, 324 of the interposer 40 along the long sides of the interposer 40. Accordingly, the signal routing lengths for pixel detectors 126 along the short edges of the interposer 40 and the overlying radiation sensor 80 may be shorter than the signal routing lengths for pixel detectors 126 along the long edges of the interposer 40 and the overlying radiation sensor 80. This may help to facilitate equalization of pixel response characteristics, since it has been found that pixel detectors 126 near the short edges of the radiation sensor 80 tend to exhibit worse performance than the pixel detectors 126 near the long edges of the radiation sensor 80. Alternatively, $d_1$ may be equal to or greater than $d_2$.

In various embodiments, the first minimum offset distance $d_1$ and/or the second minimum offset distance $d_2$ of each ASIC 130 may be less than a minimum distance between the center c of the interposer 40 and a peripheral edge of the respective ASIC 130. Accordingly, the signal routing lengths for pixel detectors 126 near the center c of the interposer 40 may be greater than the signal routing lengths for pixel detectors 126 in the edge and corner regions of the interposer 40.

Figures 5A, 5B:
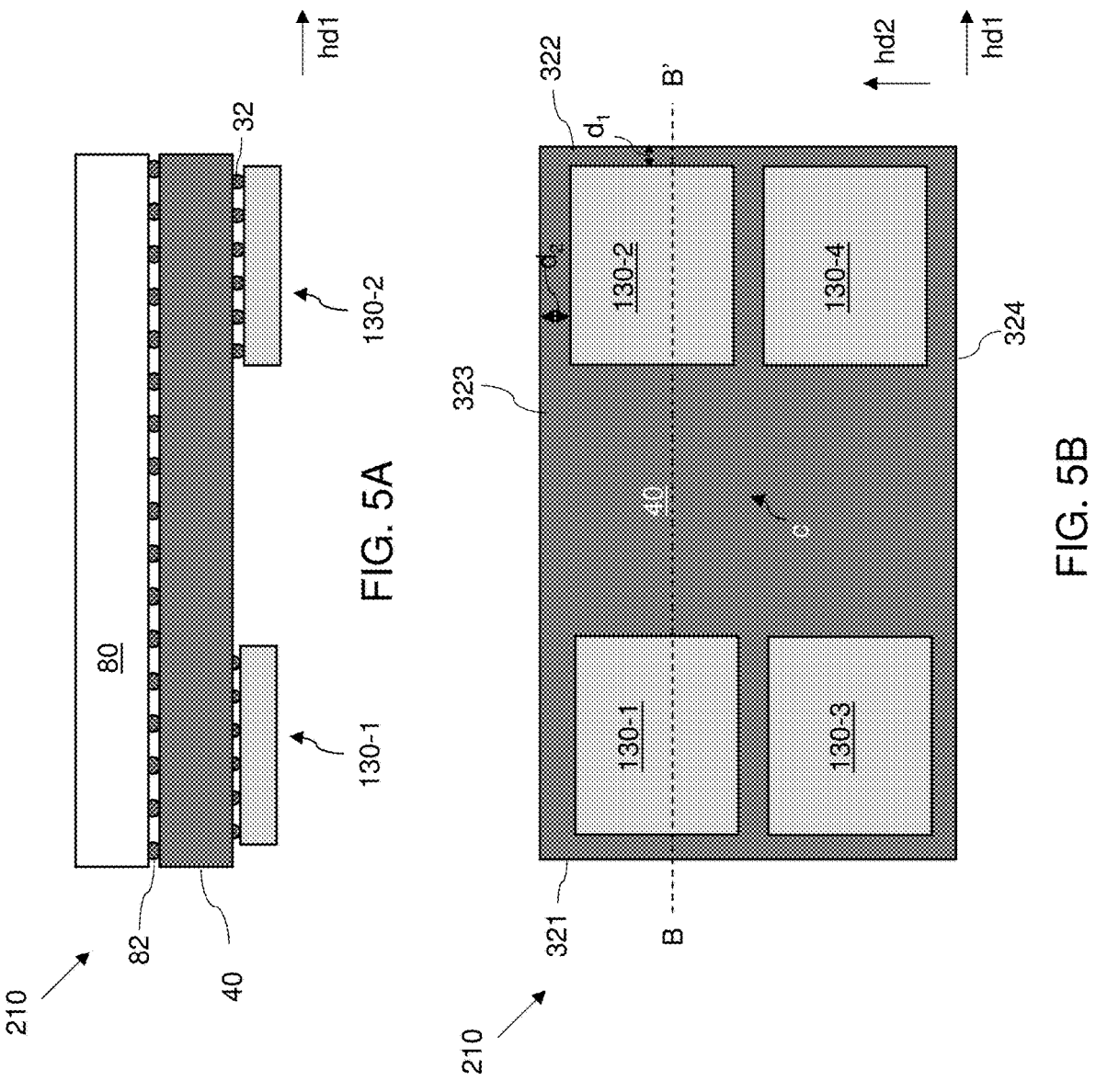
FIG. 5A is a vertical cross-section view of a portion of a radiation detector unit according to another embodiment of the present disclosure.
FIG. 5B is a bottom view of the portion of the radiation detector unit of FIG. 5A.

FIG. 5A is a vertical cross-section view of a portion of a radiation detector unit 210 according to another embodiment of the present disclosure. FIG. 5B is a bottom view of the portion of the radiation detector unit 210 of FIG. 5A. The vertical cross-section view of FIG. 5A is taken along line B-B' in FIG. 5B. The radiation detector unit 210 of FIGS. 5A and 5B may differ from the radiation detector unit 210 of FIGS. 4A and 4B in that four ASICs 130 may be mounted to the back side of the interposer 40. The four ASICs 130 may be arranged such that each ASIC 130 is located proximate to a respective corner of the interposer 40. Referring to FIG. 5B, a first ASIC 130-1 is located proximate to a first corner of the interposer 40 (i.e., where the first peripheral edge 321 meets the third peripheral edge 323), a second ASIC 130-2 is located proximate to a second corner of the interposer 40 (i.e., where the second peripheral edge 322 meets the third peripheral edge 323), a third ASIC 130-3 is located proximate to a third corner of the interposer 40 (i.e., where the first peripheral edge 321 meets the fourth peripheral edge 324), and a fourth ASIC 130-4 located proximate to a fourth corner of the interposer 40 (i.e., were the second peripheral edge 322 meets the fourth peripheral edge 324). Each of the ASICs 130 may have a first minimum offset distance, $d_1$, between a peripheral edge of the ASIC 130 and the closer of the first peripheral edge 321 and the second peripheral edge 322 of the interposer 40, and a second minimum offset distance, $d_2$, between a peripheral edge of the ASIC 130 and the closer of the third peripheral edge 323 and the fourth peripheral edge 324 of the interposer 40. In some embodiments, $d_1$ may be less than $d_2$, although it will be understood that in other embodiments, $d_1$ may be equal to or greater than $d_2$. In some embodiments, $d_1$ and/or $d_2$ of each of the ASICs 130 may be less than a minimum distance between the center c of the interposer 40 and a peripheral edge of the respective ASIC 130.

Figures 6A, 6B:
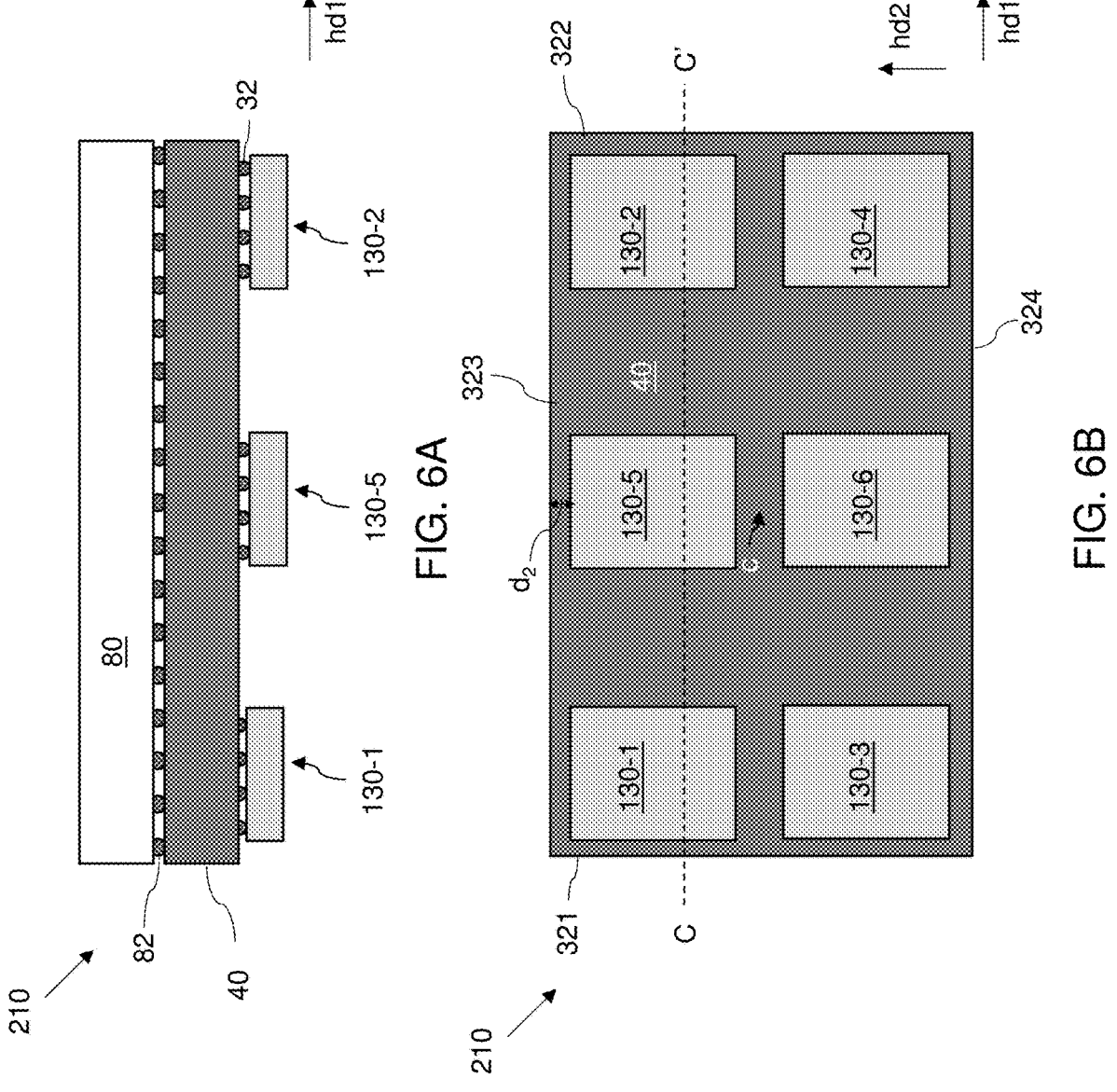
FIG. 6A is a vertical cross-section view of a portion of a radiation detector unit according to another embodiment of the present disclosure.
FIG. 6B is a bottom view of the portion of the radiation detector unit of FIG. 6A.

FIG. 6A is a vertical cross-section view of a portion of a radiation detector unit 210 according to another embodiment of the present disclosure. FIG. 6B is a bottom view of the portion of the radiation detector unit 210 of FIG. 6A. The vertical cross-section view of FIG. 6A is taken along line C-C' in FIG. 6B. The radiation detector unit 210 of FIGS. 6A and 6B may be similar to the radiation detector unit of FIGS. 5A and 5B in that a first ASIC 130-1, a second ASIC 130-2, a third ASIC 130-3, and a fourth ASIC 130-4 may be mounted to the back side of the interposer 40 such that each of the first ASIC 130-1, the second ASIC 130-2, the third ASIC 130-3, and the fourth ASIC 130-4 are located proximate to respective corners of the interposer 40. The radiation detector unit 210 of FIGS. 6A and 6B additionally includes a fifth ASIC 130-5 and a sixth ASIC 130-6 mounted to the back side of the interposer 40. The fifth ASIC 130-5 may be located between the first ASIC 130-1 and the second ASIC 130-2 along the first horizontal direction hd1, and may be laterally offset from the center c of the interposer 40 along the second horizontal direction hd2. The sixth ASIC 130-6 may be located between the third ASIC 130-3 and the fourth ASIC 130-4 along the first horizontal direction hd1, and may be laterally offset from the center c of the interposer 40 along the second horizontal direction hd2. The fifth ASIC 130-5 and the sixth ASIC 130-6 may have a second minimum offset distance, $d_2$, between a peripheral edge of the ASIC 130-5, 130-6 and the third peripheral edge 323 and the fourth peripheral edge 324 of the interposer, respectively. The second minimum offset distances $d_2$ of the fifth ASIC 130-5 and the sixth ASIC 130-6 may be the same as the second minimum offset distances $d_2$ of the first, second, third and fourth ASICs 130-1, 130-2, 130-3 and 130-4. In some embodiments, $d_2$ of each of fifth and sixth ASICs 130-5 and 130-6 may be less than a minimum distance between the center c of the interposer 40 and a peripheral edge of the respective ASIC 130-5 and 130-6.

Figures 7A, 7B:
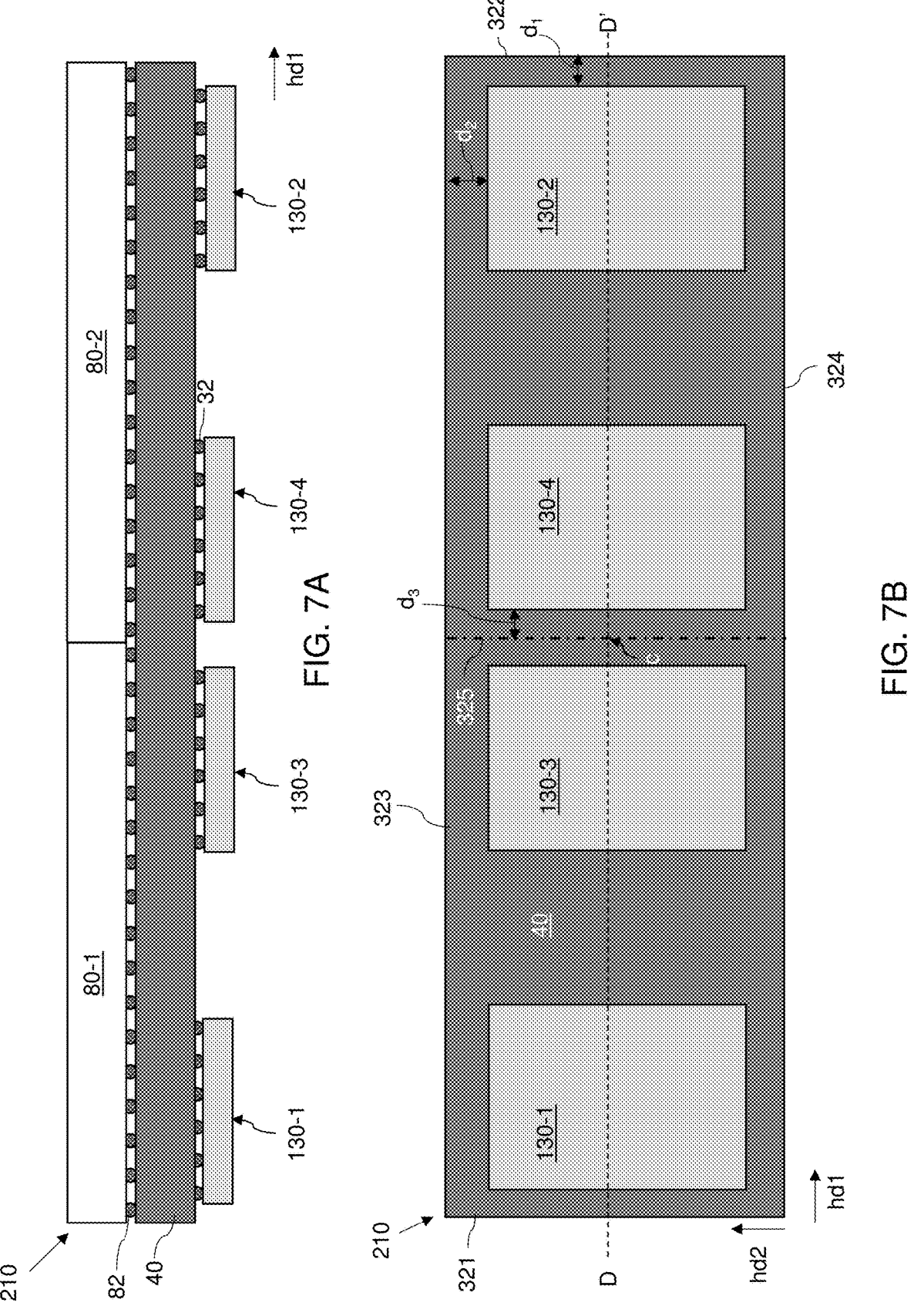
FIG. 7A is a vertical cross-section view of a portion of a radiation detector unit according to yet another embodiment of the present disclosure.
FIG. 7B is a bottom view of the portion of the radiation detector unit of FIG. 7A.

FIG. 7A is a vertical cross-section view of a portion of a radiation detector unit 210 according to yet another embodiment of the present disclosure. FIG. 7B is a bottom view of the portion of the radiation detector unit 210 of FIG. 7A. The vertical cross-section view of FIG. 7A is taken along line D-D' in FIG. 7B. In the embodiment radiation detector unit 210 shown in FIGS. 7A and 7B, multiple radiation sensors 80 are bonded to the front side of the interposer 40. In the exemplary embodiment of FIGS. 7A and 7B, a pair of radiation sensor units 80 are mounted to the front side of the interposer 40 such that a first radiation sensor 80-1 and a second radiation sensor 80-2 are in an abutting configuration extending along the first horizontal direction hd1. It will be understood that in other embodiments, more than two radiation sensors 80 may be mounted to the front side of the interposer 40 and/or multiple radiation sensors 80 may be mounted to interposer 40 in an abutting configuration along the second horizontal direction hd2.

In embodiments in which multiple radiation sensors 80 are mounted to the front side of the interposer 40, the peripheral edges of the radiation sensors 80 do not all vertically coincide with a corresponding peripheral edge 321, 322, 323 or 325 of the interposer 40. In other words, at least one peripheral edge of each of the radiation sensors 80 vertically overlies an interior region of the interposer 40. In the embodiment of FIGS. 7A and 7B, this is schematically illustrated by the dashed-dotted line 325 shown in FIG. 7B, which vertically underlies the abutting peripheral edges of the pair of radiation sensors 80-1 and 80-2 mounted to the interposer 40.

The radiation detector unit 210 of FIGS. 7A and 7B may have detector read-out circuitry having a distributed configuration including multiple ASICs 130 mounted to the back side of the interposer 40 and electrically coupled to the pixel detectors 126 of the pair of radiation sensors 80. A first ASIC 130-1 may be located on a first side of the interposer 40 that is adjacent to a first peripheral edge 321 of the interposer 40, and a second ASIC 130-2 may be located on a second side of the interposer 40 that is adjacent to a second peripheral edge 322 that is opposite the first peripheral edge 321. In the embodiment of FIGS. 7A and 7B, the first peripheral edge 321 and the second peripheral edge 322 of the interposer 40 may both extend along the relatively shorter horizontal dimension (i.e., the width dimension W) of the rectangularly-shaped interposer 40. Each of the first and second ASICs 130-1 and 130-2 may have a first minimum offset distance, $d_1$, between a peripheral edge of the ASIC 130-1, 130-2 and the first or second peripheral edge 321, 322 of the interposer 40 that is closest to the respective ASIC 130-1, 130-2. The interposer 40 may further include a third peripheral edge 323 and a fourth peripheral edge 324 extending parallel to one another along the relatively longer horizontal dimension (i.e., the length dimension L) of the interposer 40. Each of the first and second ASICs 130-1 and 130-2 may have a second minimum offset distance, $d_2$, between a peripheral edge of the ASIC 130 and the third peripheral edge 323 and the fourth peripheral edge 324 of the interposer 40. In some embodiments, $d_1$ may be less than $d_2$, although it will be understood that in other embodiments, $d_1$ may be equal to or greater than $d_2$. In some embodiments, $d_1$ and/or $d_2$ of each of the first and second ASICs 130-1 and 130-2 may be less than a minimum distance between the center c of the interposer 40 and a peripheral edge of the respective ASIC 130-1 and 130-2.

The radiation detector unit 210 of FIGS. 7A and 7B additionally includes a third ASIC 130-3 and a fourth ASIC 130-4 mounted to the back side of the interposer 40. The third ASIC 130-3 may be located between the first ASIC 130-1 and the second ASIC 130-2 along the first horizontal direction hd1, and may be laterally offset from the center c of the interposer 40 towards the same side of the interposer 40 as the first ASIC 130-1. The fourth ASIC 130-4 may be located between the first ASIC 130-1 and the second ASIC 130-2 along the first horizontal direction hd1, and may be laterally offset from the center c of the interposer 40 towards the same side of the interposer 40 as the second ASIC 130-2. The first ASIC 130-1 and the third ASIC 130-3 may underlie the first radiation sensor 80-1 and the second ASIC 130-2 and the fourth ASIC 130-4 may underlie the second radiation sensor 80-2. The third ASIC 130-3 and the fourth ASIC 130-4 are laterally offset from (i.e., they do not underlie) the abutting peripheral edges of the first and second radiation sensor 80-1 and 80-2, as indicated by the dashed-dotted line 325 in FIG. 7B. Thus, there may be a third minimum offset distance, $d_3$, between a peripheral edge of the third and fourth ASICs 130-3 and 130-4 and the abutting peripheral edges of the overlying first and second radiation sensors 80-1 and 80-2. In some embodiments, the third minimum offset distances, $d_3$, between the abutting peripheral edges of the first and second radiation sensors 80-1 and 80-2 and the peripheral edges of the third and the fourth ASICs 130-3 and 130-4 may be equal to the first minimum offset distances, $d_1$, between the peripheral edges 321 and 322 of the interposer and the peripheral edges of the first and second ASICs 130-1 and 130-2. Alternatively, the third minimum offset distances $d_3$ may be greater than or less than the first minimum offset distances $d_1$. In various embodiments, the third minimum offset distances $d_3$ may be less than the distance between each of the third and fourth ASICs 130-3 and 130-4 and the center of the radiation sensor 80-1, 80-2 that overlies the respective ASIC 130-3 and 130-4.

Figures 8A, 8B:
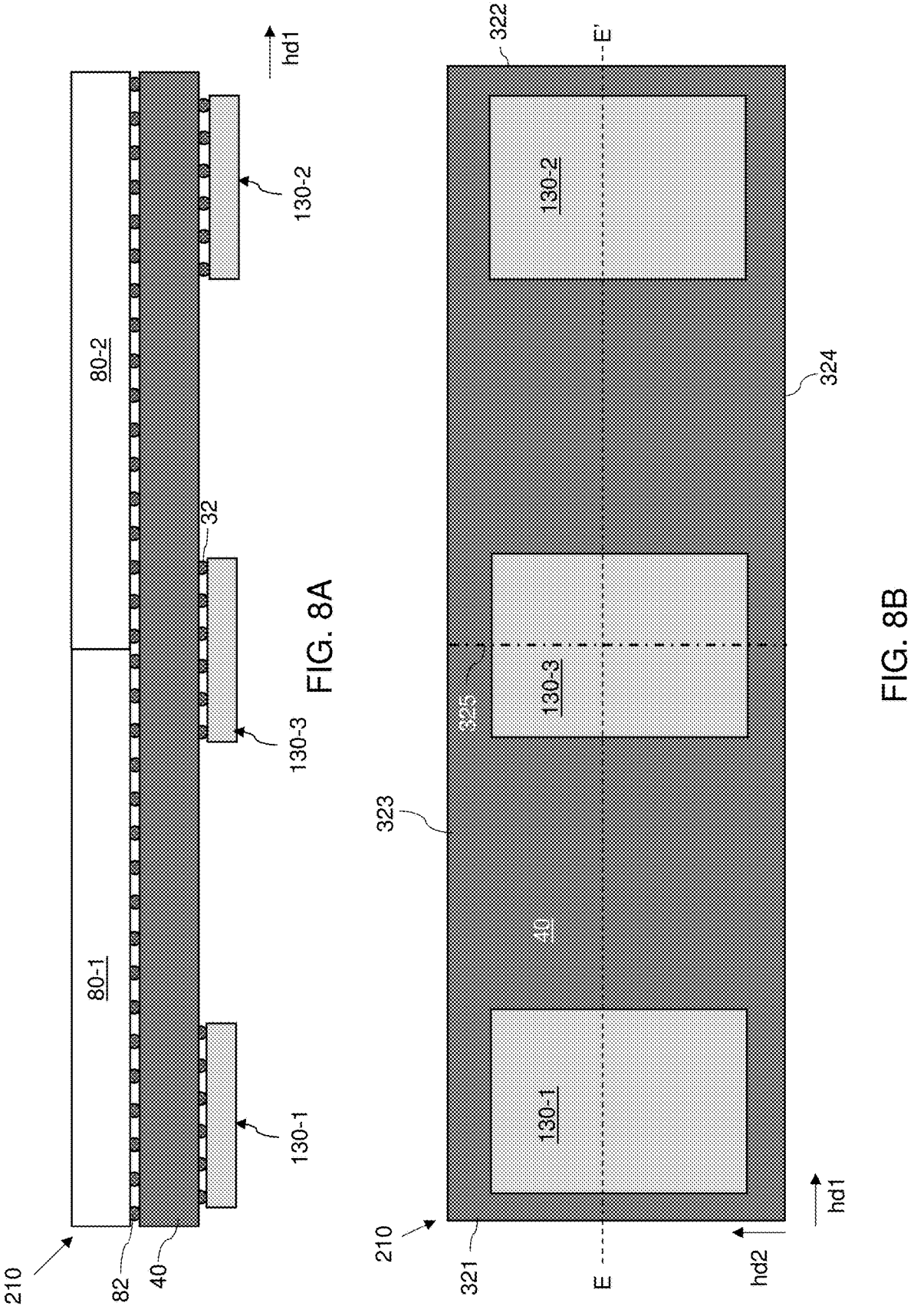
FIG. 8A is a vertical cross-section view of a portion of a radiation detector unit according to another embodiment of the present disclosure.
FIG. 8B is a bottom view of the portion of the radiation detector unit of FIG. 8A.

FIG. 8A is a vertical cross-section view of a portion of a radiation detector unit 210 according to another embodiment of the present disclosure. FIG. 8B is a bottom view of the portion of the radiation detector unit 210 of FIG. 8A. The vertical cross-section view of FIG. 8A is taken along line E-E' in FIG. 8B. The radiation detector unit 210 of FIGS. 8A and 8B is similar to the radiation detector unit 210 of FIGS. 7A and 7B in that a pair of radiation sensor units 80 are mounted to the front side of the interposer 40 such that a first radiation sensor 80-1 and a second radiation sensor 80-2 are in an abutting configuration extending along the first horizontal direction hd1. The radiation detector unit 210 of FIGS. 8A and 8B differs from the radiation detector unit 210 of FIGS. 7A and 7B in that only three ASICs 130 are mounted to the back side of the interposer 40. A first ASIC 130-1 is located on a first side of the interposer 40 that is adjacent to a first peripheral edge 321 of the interposer 40, and a second ASIC 130-2 is located on a second side of the interposer 40 that is adjacent to a second peripheral edge 322 that is opposite the first peripheral edge 321. A third ASIC 130-3 is located between the first ASIC 130-1 and the second ASIC 130-2 along the first horizontal direction hd1. The third ASIC 130-3 in this embodiment underlies the abutting peripheral edges of the first and second radiation sensors 80-1 and 80-2 (indicated by dashed-dotted line 325 in FIG. 8B). Thus, the third ASIC 130-3 partially underlies both the first radiation sensor 80-1 and the second radiation sensor 80-2.

Figures 9, 10:
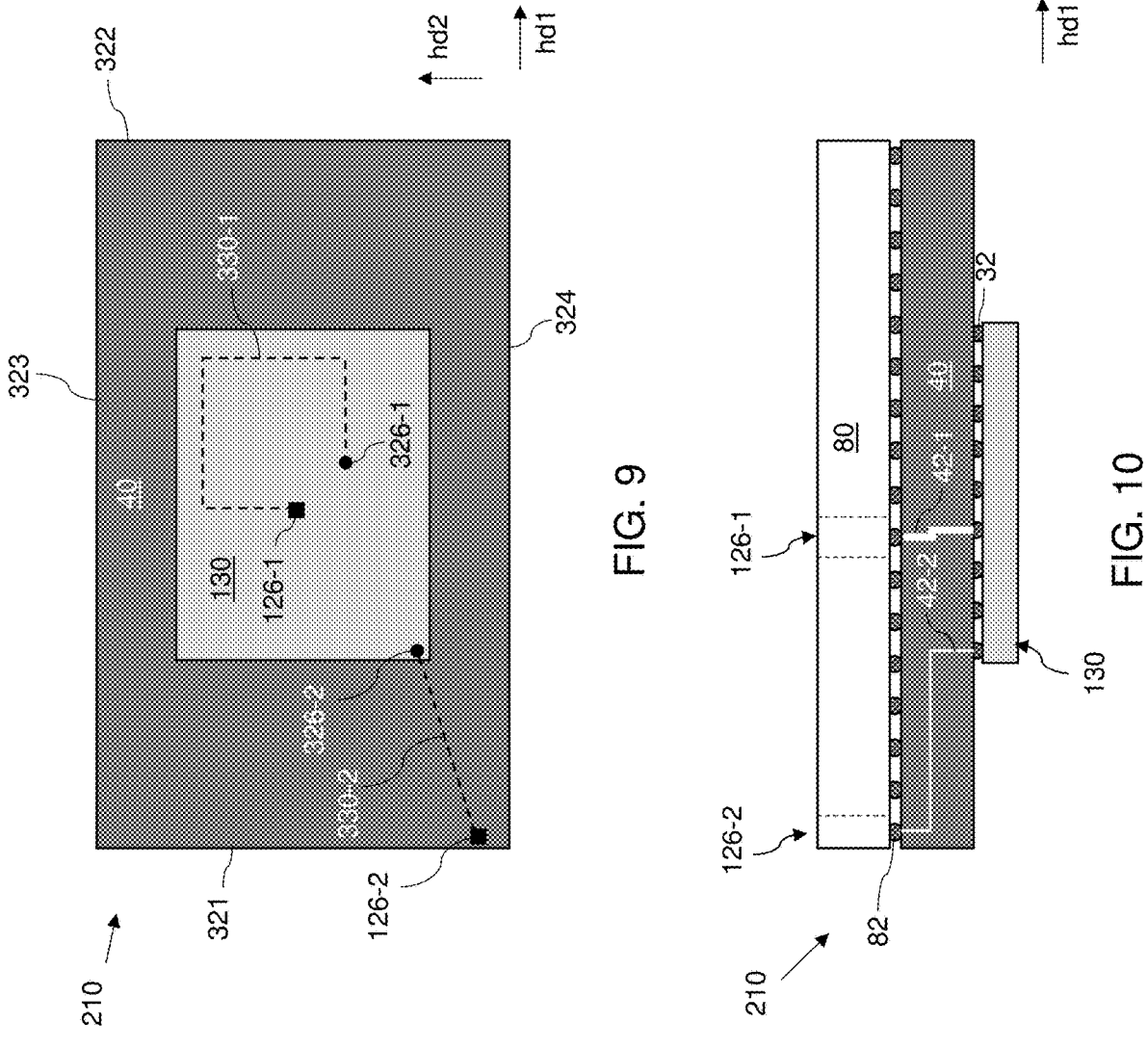
FIG. 9 is a bottom view of an interposer having an ASIC mounted to the back side of the interposer that schematically illustrates a variation in the routing lengths of conductive traces for a center pixel detector and an edge pixel detector according to an embodiment of the present disclosure.
FIG. 10 is a vertical cross-section view of a radiation detector unit illustrating varying trace thicknesses for a center pixel detector and an edge pixel detector according to an embodiment of the present disclosure.

Further embodiments include providing increased equalization of the pixel response characteristics by varying the characteristics of the conductive interconnect structures 42 of the interposer 40 that carry the detection signals between each of the pixel detectors 126 and a corresponding input channel of an ASIC 130. In some embodiments, this may be achieved by varying the routing lengths within the interposer 40 to control the amount of parasitic capacitance added to each input channel of the ASIC 130. FIG. 9 is a bottom view of an interposer 40 having an ASIC 130 mounted to the back side of the interposer 40. FIG. 9 schematically illustrates the locations of a pair of pixel detectors 126-1 and 126-2 of a radiation sensor 80 (not visible in FIG. 9) mounted to the front side of the interposer 40. A first pixel detector 126-1 is located near the center of the radiation sensor 80 and therefore likely exhibits relatively good performance characteristics (e.g., a lower ER). A second pixel detector 126-2 is located near an edge of the radiation sensor 80 and therefore likely exhibits relatively poorer performance characteristics (e.g., a higher ER). FIG. 9 also schematically indicates the locations of the respective bonding pads 326-1 and 326-2 on the front surface of the ASIC 130 that couple conductive interconnect structures 42-1 and 42-2 from the first and second pixel detectors 126-1 and 126-2 to respective input channels of the ASIC 130. The dashed lines 330-1 and 330-2 schematically indicate the routing paths of the detection signals through the interposer 40 (i.e., the paths of the conductive interconnect structures 42-1 and 42-2 shown in FIG. 4A which carry the detection signals) between each of the pixel detectors 126-1 and 126-2 of the radiation sensor 80 and the corresponding bonding pads 326-1 and 326-2 of the ASIC 130. In the embodiment of FIG. 9, the second pixel detector 126-2 in an edge region of the radiation sensor 80 has the shortest routing path 330-2 that follows a direct straight-line pathway between the second detector pixel 126-2 and the corresponding bonding pad 326-2 on the ASIC 130. The first pixel detector 126-1 in the center region of the radiation sensor 80 has the longest routing path 330-1 that follows a tortuous pathway between the detector pixel 126-1 and the corresponding bonding pad 326-1 on the ASIC 130. The longer routing path of the first detector pixel 126-1 means that a greater amount of parasitic capacitance is added to the output signals from the first pixel detector 126-1 than is added to the output signals from the second pixel detector 126-2. This may help to reduce the difference in pixel response characteristics (e.g., ER response) between the better-performing pixel detector 126-1 near the center of the radiation sensor 80 and the worse-performing pixel detector 126-2 near the edge of the radiation sensor 80. In various embodiments, the interposer 40 may be designed such that the signal routing lengths of each pixel detector 126 of the overlying radiation sensor 80 may be a function of the likely performance characteristics of the respective pixel detector 126. In particular, pixel detectors 126 that tend to exhibit the worst performance characteristics, such as pixel detectors 126 near the peripheral edges 321, 322, 323 and 324 of the radiation sensor 80. In particular, pixel detectors 126 along the shorter peripheral edges 321 and 322 of a rectangular radiation sensor 80, may be provided the shortest routing lengths, and pixel detectors 126 that tend to exhibit better performance characteristics (e.g., pixel detectors 126 in an interior/central region of the radiation sensor 80) may be provided with correspondingly longer routing lengths. The longer routing lengths may be provided by forming interconnect structures 42-1 having a tortuous (i.e., non-linear) path within one or more horizontal planar interconnect levels of the interposer 40 and/or a non-linear vertical path by providing additional vias extending vertically between different interconnect levels. Further, although the embodiment of FIG. 9 illustrates a single ASIC 130, in other embodiments, providing variations in the signal routing path lengths to compensate for variations in pixel performance as shown in FIG. 9 may be utilized in a radiation detector unit 210 having a distributed readout circuitry including multiple ASICs 130 as described above with reference to FIGS. 4A-8B.

In other embodiments, providing increased equalization of the pixel response characteristics may be achieved by varying the thickness of the conductive interconnect structures 42 of the interposer 40 to control the amount of parasitic capacitance added to each input channel of the ASIC 130. FIG. 10 is a vertical cross-section view of a radiation detector unit 210 including an interposer 40, a radiation sensor 80 mounted to a front side of the interposer 40, and an ASIC 130 mounted to the back side of the interposer 40. FIG. 10 illustrates a first pixel detector 126-1 located near the center of the radiation sensor 80 and a second pixel detector 126-2 located near an edge of the radiation sensor 80. The interposer 40 includes relatively thicker conductive interconnect structures 42-1 coupling the output signals from the first pixel detector 126-1 to the ASIC 130 and relatively thinner conductive interconnect structures 42-2 coupling the output signals from the first pixel detector 126-2 to the ASIC 130. The parasitic capacitance added to the output detector signals transmitted through the interposer

40 is related to the widths of the interconnect structures 42 through which the signals are transmitted, where wider (i.e., thicker) interconnect structures 42 result in more added capacitance. The relatively wider interconnect structures 42-1 coupling the output signals of the first detector pixel 126-1 to the ASIC 130 means that a greater amount of parasitic capacitance is added to the output signals from the first pixel detector 126-1 than is added to the output signals from the second pixel detector 126-2. This may help to reduce the difference in pixel response characteristics (e.g., ER response) between the better-performing pixel detector 126-1 near the center of the radiation sensor 80 and the worse-performing pixel detector 126-2 near the edge of the radiation sensor 80. In various embodiments, the interposer 40 may be designed such that the widths of the conductive interconnect structures 42 carrying the output signals from each pixel detector 126 may be a function of the likely performance characteristics of the respective pixel detector 126. In particular, the conductive interconnect structures 42 which carry the output signals from pixel detectors 126 near the edges of the radiation sensor 80 may be relatively thin, while thicker conductive interconnect structures 42 may be used to carry the output signals from pixel detectors 126 in an interior region of the radiation sensor 80. Adding parasitic capacitance to the better performing pixels by providing relatively wider (i.e., thicker) conductive traces in the interposer 40 may help compensate for variations in pixel performance and provide a more uniform pixel response profile across the radiation detector unit 210.

Other techniques may be used to selectively add parasitic capacitance to the output signals from some of the pixel detectors 126, such as by adding neighboring traces (in the same horizontal routing level and/or in a different routing level above and/or below a given trace) and/or adding routing vias. Two conductive traces located sufficiently close to each other in the horizontal and/or vertical direction may result in a parasitic capacitance between the traces. The parasitic capacitance changes the total capacitance of each trace relative to a case where the two traces are spaced farther apart. In some embodiments, both the lengths and the widths of the interconnect structures 42 may be varied to compensate for variations in pixel performance, where relatively longer trace lengths and/or increased widths may be used to transmit the output signals from better-performing pixels. Increased lengths and widths increase capacitance of the traces.

In some embodiments, providing above-described features to the interposer 40 (i.e., providing multiple ASIC bonding locations, locating at least one ASIC bonding location closer to an edge than to the center of the interposer 40, and/or varying the lengths and/or widths of the conductive interconnect structures 42 in the interposer 40 that carry the output signals from different pixel detectors 126 to an input channel of an ASIC 130) may be used to provide a radiation detector unit 210 in which the ER response of edge and center pixel detectors of a radiation sensor 80 mounted to the interposer 40 is equalized to within 10% of each other. In some embodiments, the ASIC 130 may be configured to provide additional ER equalization, such as by providing additional capacitance within the ASIC to further equalize the ER response across the ASIC readout channels.

Additional non-uniformities in the pixel response characteristics may be caused by thermal non-uniformities in the radiation detector unit 210. The primary source of thermal energy in a radiation detector unit 210, such as shown in FIG. 3A is the ASIC 130. Most of the thermal energy generated by the ASIC 130 flows downward to the above-described carrier board 60 and the substrate/heat sink 90, but a portion of the thermal energy flows upwards to the interposer 40 and the overlying radiation sensor 80. Since the direction of heat flow in the radiation detector unit 210 is primarily vertical rather than lateral, this means that the region of the radiation sensor 80 directly overlying the ASIC 130 may receive more thermal energy (i.e., heat) than the remainder of the radiation sensor 80. This results in thermal non-uniformities in the radiation sensor 80 (i.e., a hotter center region than edge regions) that may contribute to non-uniformity in the detector pixel responses.

Figure 11:
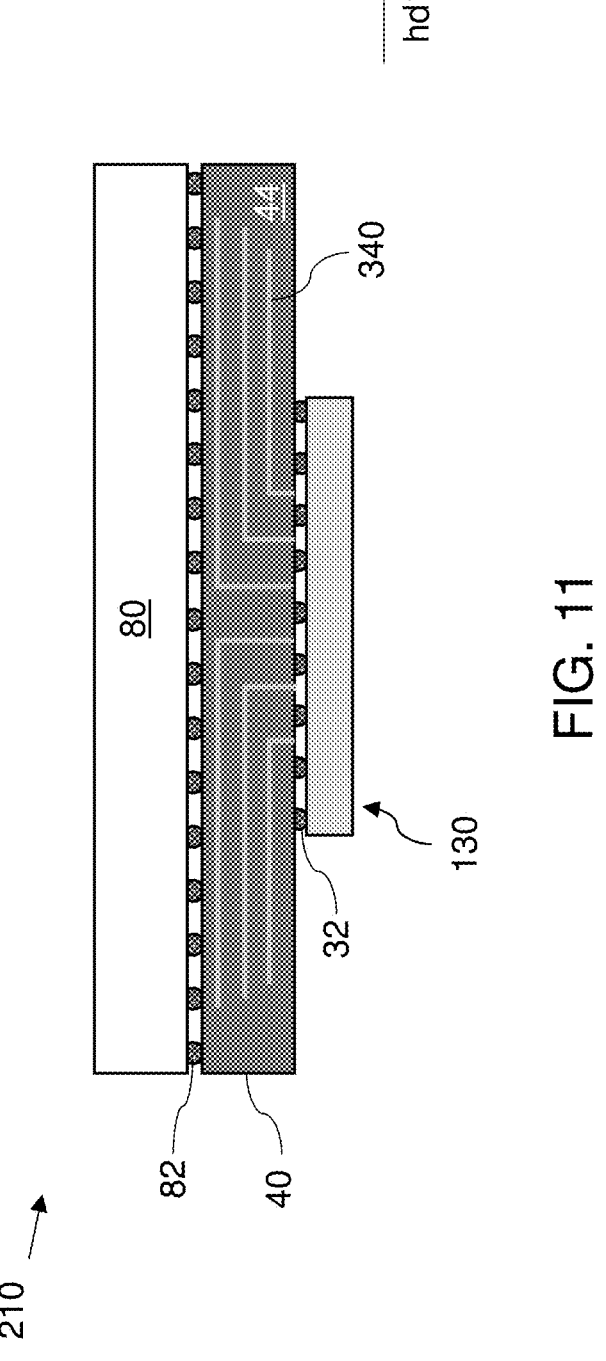
FIG. 11 is a vertical cross-section view of a radiation detector unit including thermal redistribution structures within the interposer according to an embodiment of the present disclosure.

Various embodiments include features in the interposer 40 designed to mitigate thermal non-uniformity in the overlying radiation sensor 80. In particular, the interposer 40 may include thermal redistribution structures, such as metal vias and/or lines that may redirect thermal energy within the interposer 40 to provide a more uniform thermal profile in the overlying radiation sensor 80. FIG. 11 is a vertical cross-section view of a radiation detector unit 210 including thermal redistribution structures 340 within the interposer 40. The thermal redistribution structures 340 may include metal vias and lateral thermal traces that are configured to carry thermal energy (i.e., heat) generated by the ASIC 130 in a lateral direction such that the thermal energy may be more uniformly distributed within the interposer 40 and the overlying radiation sensor(s) 80. The thermal redistribution structures 340 may be non-functional structures, meaning that they do not carry electrical power or data, but are thermally-conductive structural elements formed within the insulating matrix 44 of the interposer 40 that are configured to spread thermal energy within the interposer 40.

Figure 12:
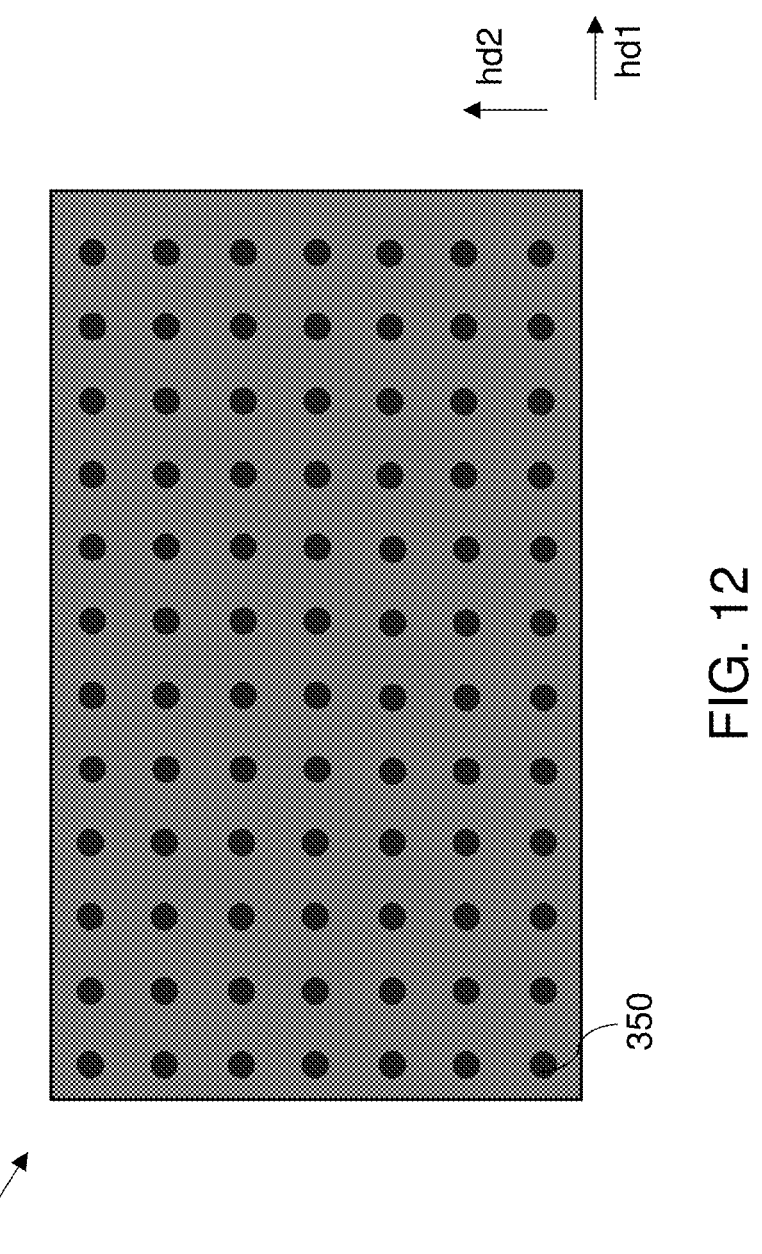
FIG. 12 is a plan view of an interposer having a plurality of strain-relief features according to an embodiment of the present disclosure.

Additional non-uniformities in the pixel response characteristics may be caused by strain-related warpage at the interface between the interposer 40 and the radiation sensor 80 in the radiation detector unit 210. The warpage may be due to temperature cycling of the interposer during attachment of one or more radiation sensors 80 to the front side of the interposer 40 and one or more ASICs 130 to the rear side of the interposer 40. Various embodiments include an interposer 40 that includes strain-relief features designed to minimize warpage at the interface with the radiation sensor 80. FIG. 12 is a plan view of an interposer 40 having a plurality of strain-relief features 350. In various embodiments, the strain-relief features 350 may include a plurality of vias through the interposer 40. The vias may include open vias (i.e., void regions or holes extending through the interposer 40). Alternatively, the vias may include a suitable filler material that may provide a degree of mechanical compliance. The strain-relief features 350 may help to reduce warpage at the interface between the interposer 40 and the radiation sensor 80 and thereby improve the uniformity of the pixel response characteristics of the radiation detector unit 210. In some embodiments, warpage may be further reduced by using a distributed detector readout circuitry configuration in which a plurality of ASICs 130 are mounted to different regions of the interposer 40.

Referring to all drawings of the present disclosure and according to an aspect of the present disclosure, an X-ray imaging system 100 is provided. The X-ray imaging system 100 in various embodiments may include a computed tomography system having a radiation source 110 configured to emit an X-ray beam, a detector array 300 including a plurality of detector modules 200 configured to receive the X-ray beam from the radiation source 110 through an intervening space configured to contain an object 10 therein (e.g., through the support 105), and an image reconstruction system including a computer 160 configured to run an automated image reconstruction algorithm on detection signals generated from the detector array 300, which can be employed as the detector array 300 in the system of FIG. 1A.

The devices of the embodiments of the present disclosure can be employed in various radiation detection systems including computed tomography (CT) imaging systems. Any direct conversion radiation sensors may be employed such as radiation sensors employing Si, Ge, GaAs, CdTe, CdZnTe, and/or other similar semiconductor materials.

The radiation detectors of the present embodiments may be used for medical imaging, such as in Low-Flux applications in Nuclear Medicine (NM), whether by Single Photon Emission Computed Tomography (SPECT) or by Positron Emission Tomography (PET), or as radiation detectors in High-Flux applications as in X-ray Computed Tomography (CT) for medical applications, and for non-medical imaging applications, such as in baggage security scanning and industrial inspection applications.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

The invention claimed is:

1. A device, comprising:
   an interposer configured to electrically connect a pixelated radiation sensor positioned on a front side of the interposer to an application-specific integrated circuit (ASIC) positioned on a back side of the interposer, wherein the interposer has at least one feature which equalizes the energy resolution (ER) response of edge and center pixel detectors of the pixelated radiation sensor within 10% of one another, and wherein the at least one feature comprises at least one of a via and a lateral trace within the interposer that does not carry electrical power or data signals and is configured to provide at least one of thermal redistribution and strain-relief.

2. The device of claim 1, wherein the at least one feature comprises at least one of metal vias and lateral metal traces configured to provide thermal redistribution.

3. The device of claim 1, wherein the least one of the via and the lateral trace comprises the via.

4. The device of claim 1, wherein the least one of the via and the lateral trace comprises the lateral trace.

5. The device of claim 1, further comprising the pixelated radiation sensor positioned on the front side of the interposer, and the ASIC positioned on the back side of the interposer.

* * * * *